(12) United States Patent
Lin et al.

(10) Patent No.: US 12,484,252 B2
(45) Date of Patent: Nov. 25, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Tzu-Ging Lin, Hsinchu (TW); Chih-Chang Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 668 days.

(21) Appl. No.: 17/900,227

(22) Filed: Aug. 31, 2022

(65) Prior Publication Data
US 2024/0072148 A1 Feb. 29, 2024

(51) Int. Cl.
*H01L 29/423* (2006.01)
*H10D 30/67* (2025.01)
*H10D 84/01* (2025.01)
*H10D 84/03* (2025.01)

(52) U.S. Cl.
CPC ..... *H10D 30/6735* (2025.01); *H10D 30/6757* (2025.01); *H10D 84/0128* (2025.01); *H10D 84/038* (2025.01)

(58) Field of Classification Search
None
See application file for complete search history.

(56) References Cited

U.S. PATENT DOCUMENTS

| | | |
|---|---|---|
| 2020/0176375 A1 | 6/2020 | Jung et al. |
| 2020/0194403 A1 | 6/2020 | Xiao |
| 2021/0104543 A1 | 4/2021 | Xiao |
| 2022/0013523 A1 | 1/2022 | Cheng |

FOREIGN PATENT DOCUMENTS

| | | |
|---|---|---|
| TW | 201010060 A | 3/2010 |
| TW | 201331994 A | 8/2013 |
| TW | 202119479 A | 5/2021 |
| TW | 202119626 A | 5/2021 |
| TW | 202147520 A | 12/2021 |
| TW | 202209564 A | 3/2022 |

OTHER PUBLICATIONS

Office Action issued in connection with Taiwan Appl. No. 112130395 dated Sep. 9, 2024.
Office Action issued in connection with Taiwan Appl. No. 112130395 dated Feb. 12, 2025.

*Primary Examiner* — William C Trapanese
(74) *Attorney, Agent, or Firm* — FOLEY & LARDNER LLP

(57) ABSTRACT

A semiconductor device includes a first channel region extending in a first lateral direction, and comprising a first epitaxial structure; a second channel region extends in the first lateral direction, next to the first channel region along a second lateral direction, and comprising a pair of second epitaxial structures; a third channel region formed over the substrate, extending in the first lateral direction, disposed next to the first channel region along the second lateral direction, and comprising a pair of third epitaxial structures; first and second metal gate structures extend in the second lateral direction and traverse the second and third channel regions, respectively. A first upper portion of the dielectric structure has its opposite sidewalls tilted away from each other along a vertical direction extending from a top surface of the dielectric structure toward the substrate.

20 Claims, 32 Drawing Sheets

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
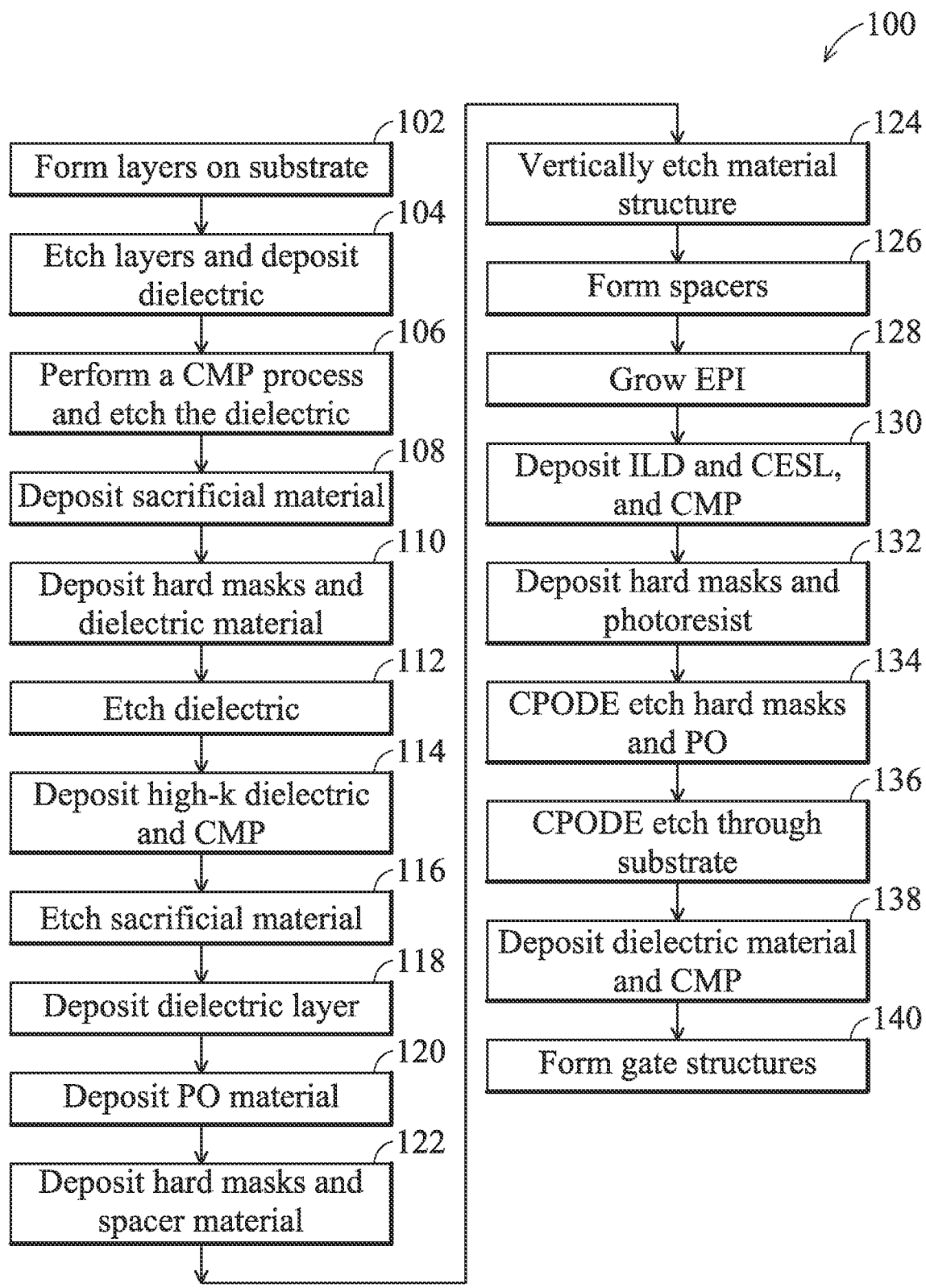
FIG. 1 is an example flow chart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of semiconductor device manufacturing techniques that include a number of transistors. During or after the manufacture of the transistor devices, certain transistor devices can be isolated from one another by forming "cuts" in the substrate in which the transistors are formed. The cuts can be filled with a dielectric material to electrically isolate the transistors from one another. However, etching processes that do not implement the techniques described herein can result in damage to the transistors and logic structures manufactured using the fabrication techniques described herein. For example, profiles of the metal gates can be damaged or otherwise negatively altered through the etching of a PO material such as polysilicon. To address these issues, the present techniques implement a controlled and multi-stage etching process, which utilizes different etching parameters when etching at different depths through the transistor devices. This etching process (sometimes referred to as cut polysilicon on diffusion edge (CPODE) technique) can be used to safely remove material from the material structures in which the transistor devices are formed without damaging the transistor devices. The etching process can define profiles which may, for example, aid the adherence of various components of a semiconductor device, avoid damage to portions of the semiconductor device, or otherwise aid a process flow for the fabrication of semiconductor devices.

FIG. 1 illustrates a flowchart of an example method 100 for making transistor devices using the CPODE processes described herein, in accordance with some embodiments. The disclosed CPODE processes may sometimes be referred to as part of a front end of line (FEOL) fabrication process. For example, at least some of the operations (or steps) of the method 100 can be used to form transistor devices, such as a nanosheet transistor devices, nanowire transistor devices, vertical transistor devices, or the like, and to electrically isolate the transistor devices from one another according to a predetermined design using CPODE techniques.

It is noted that the method 100 is merely an example, and is not intended to limit the present disclosure. Accordingly, it is understood that additional operations may be provided before, during, and after the method 100 of FIG. 1, and that some other operations may only be briefly described herein. Additionally, operations of the method 100 may be performed in an order different from that described herein to achieve desired results. In some embodiments, operations of the method 100 may be associated with the various perspective and cross-sectional views of the transistor devices at various fabrication stages as shown in FIGS. 2 to 31, respectively, which will be discussed in further detail below.

In brief overview, the method 100 starts with operation 102 of forming layers on a substrate. The method 100 continues to operation 104 of etching layers and depositing dielectrics. The method 100 continues to operation 106 of performing a chemical mechanical polish (CMP) procedure and etching the dielectric. The method 100 continues to operation 108 of depositing sacrificial material. The method 100 continues to operation 110 of depositing hardmasks and dielectric material. The method 100 continues to operation 112 of etching the dielectric. The method 100 continues to operation 114 of depositing high-k dielectric and performing a CMP process. The method 100 continues to operation 116 of etching the sacrificial material. The method 100 continues to operation 118 of depositing a dielectric layer. The method 100 continues to operation 120 of depositing a polysilicon (PO) material. The method 100 continues to operation 122 of depositing hardmasks and spacer material. The method 100 continues to operation 124 of vertically etching the material structure. The method 100 continues to operation 126 of forming spacers. The method 100 continues to operation 128 of epitaxially growing semiconductor material. The method 100 continues to operation 130 of forming an interlayer dielectric (ILD), a contact etch stop layer (CESL), and performing a CMP process. The method 100 continues to operation 132 of depositing hardmasks and photoresist. The method 100 continues to operation 134 of CPODE etching hardmasks and PO. The method 100 continues to operation 136 of CPODE etching through substrate. The method 100 continues to operation 138 of depositing a dielectric and performing a CMP process. The method 100 continues to operation 140 of forming active (e.g., metal) gate structures.

Figure 2:
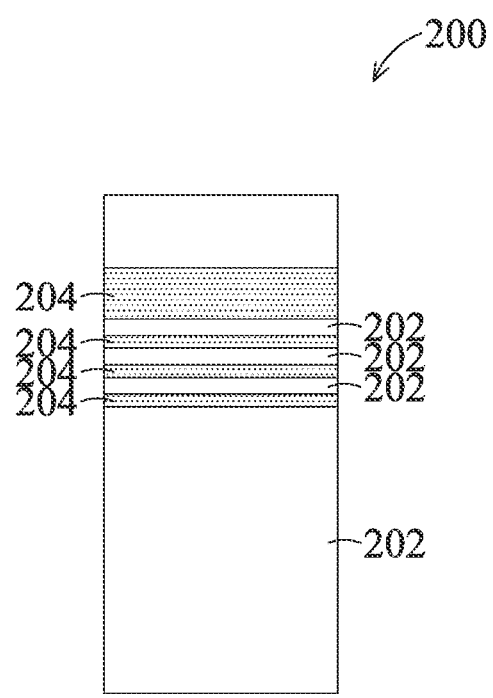
FIGS. 2, 3, 4, 5, 6, 7, 8, 9, 10, 11, 12, 13, 14, 15, 16, 17, 18, 19, 20, 21, 22, 23, 24, 25, 26, 27, 28, 29, 30, and 31 illustrate cross-sectional views of an example semiconductor device during various fabrication stages, made by the method of FIG. 1, in accordance with some embodiments.

Corresponding to operation 102 of FIG. 1, FIG. 2 is a cross-sectional view of a stack of layers that used to manufacture semiconductor devices using the techniques described herein. The stack of layers can be formed on a semiconductor substrate 202, and can include a number of alternating layers of the substrate material 202 and a first sacrificial material 204. A hardmask material can be deposited on the top layer of the sacrificial material 204.

The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer (not shown). The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The one or more layers of the sacrificial material 204 may be formed on the substrate material 202 using a material deposition process or an epitaxial growth process. The sacrificial material 204 can be removed in later process steps, and can be formed from a material that has different material properties than the substrate material 202, to facilitate selective removal or deposition techniques described herein. The sacrificial material 204 can be an alloy semiconductor material, such as SiGe.

Figure 3:
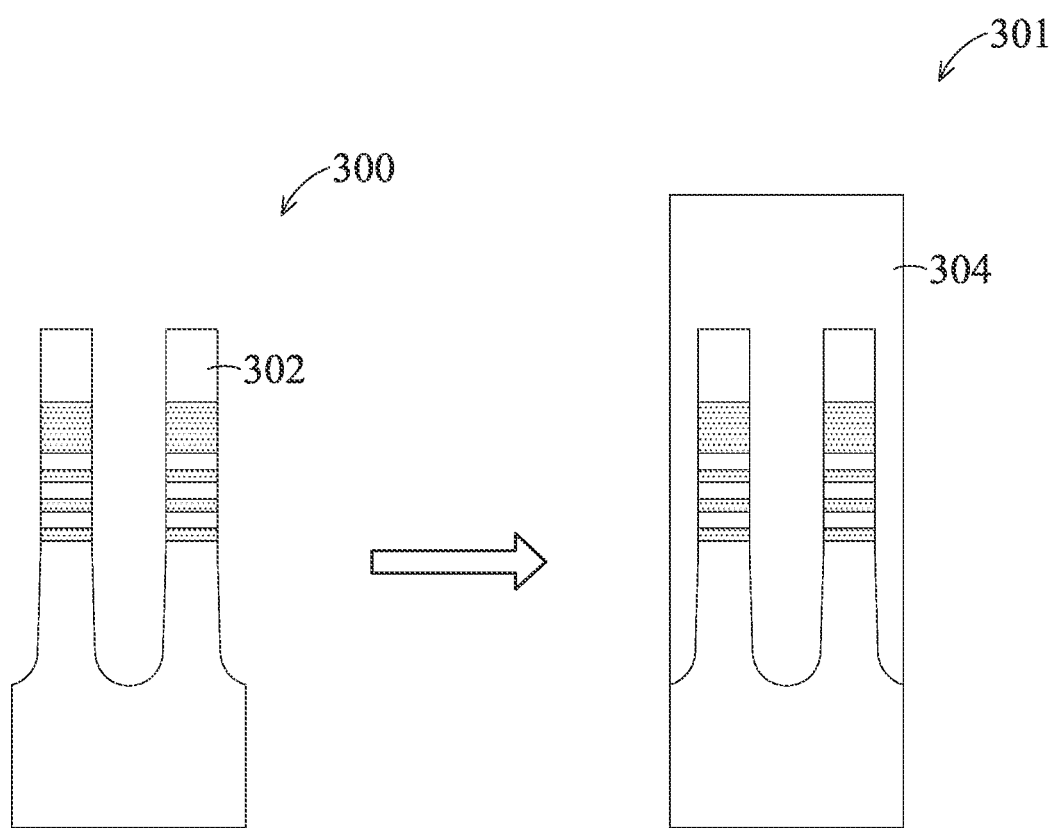

Corresponding to operation 104 of FIG. 1, FIG. 3 are cross-sectional views 300 and 301 of the stack of layers of FIG. 2, after an etching process has been applied to structures. As shown, the views 300 and 301 show the deposition of two layers of a first dielectric material 302 and a second dielectric material 304. Although two etched structures are shown, it should be appreciated that the device can include any number of etched structures which can be subsequently using an appropriate patterning and etching technique, such as while remaining within the scope of the present disclosure.

The first dielectric material 302 and the second dielectric material 304 can be any type of insulating material, including various oxides, such as silicon oxide, a nitride, or other insulators, or combinations thereof. The layer of the first dielectric material can be formed using any suitable material deposition technique, including atomic layer deposition (ALD), a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other dielectric materials and other formation processes may be used. In an example, the first dielectric material 302 or the second dielectric material 304 can be a silicon oxide. Similarly, the second dielectric material may be a different type of insulation material than the first dielectric material, and can be deposited using a suitable material deposition technique.

The first dielectric material 302 can be formed as a liner, and the second dielectric material can be deposited on top of the liner to encase the etched structures shown in the cross-sectional view 300. The first dielectric material 302 can be a liner oxide. The liner oxide (e.g., silicon oxide) may be a thermal oxide formed through a thermal oxidation of a surface layer of the substrate 202, although other suitable method may also be used to form the liner oxide.

Figure 4:
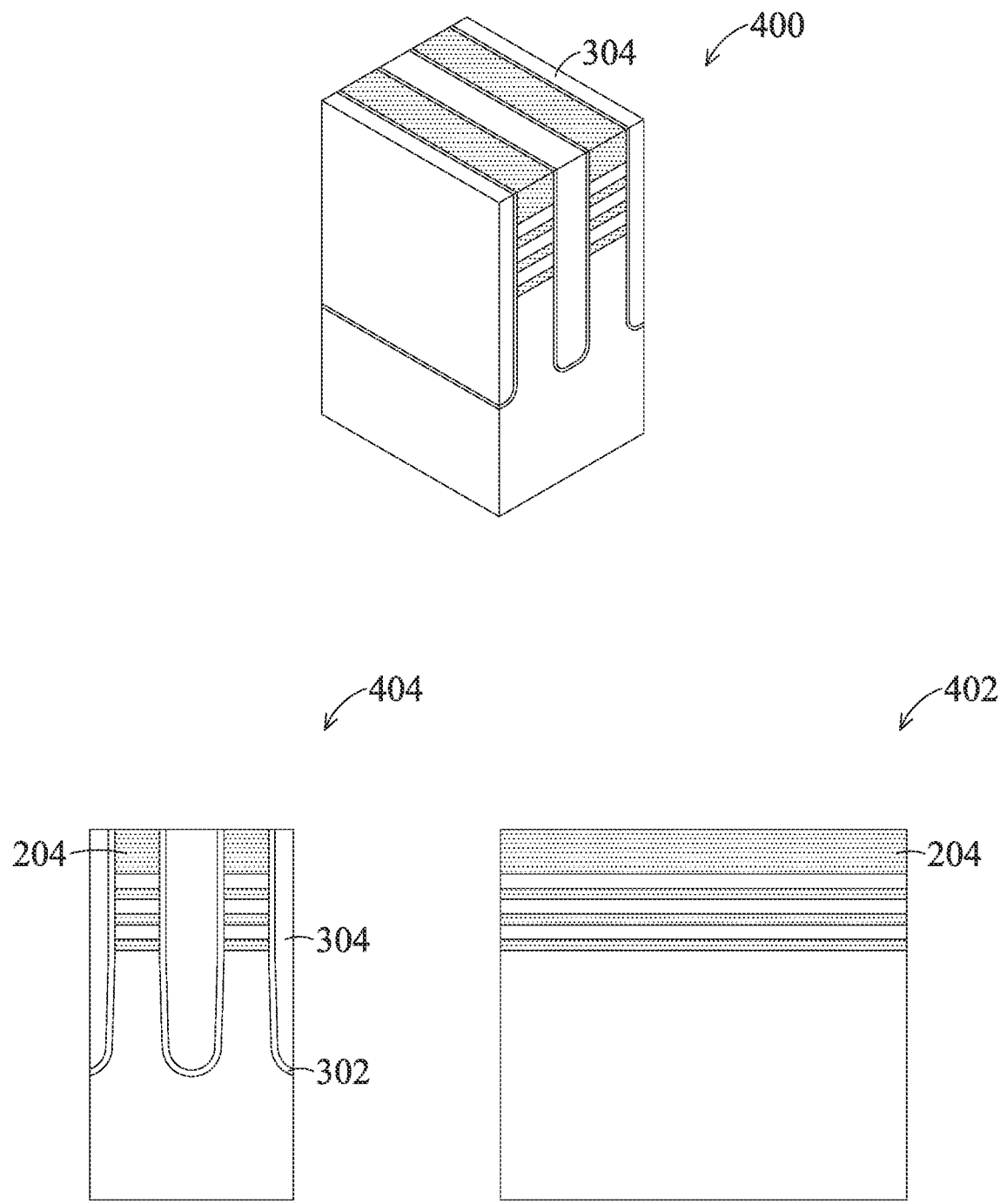

Corresponding to operation 106 of FIG. 1, FIG. 4 shows a perspective view 400 and cross-sectional views 402 and 404 of the stack of layers following a CMP process and an etching process. As shown, the etching process has removed the hardmask shown in FIGS. 2-3, and the CMP and etching process has made the top-most layer of the sacrificial material 204 level with the second dielectric material 304 described in connection with FIG. 3. The cross-sectional view 404 shows the first dielectric material 302 is also exposed at the top of the device following the CMP process. Any type of suitable CMP process or etching process can be used to remove the top layers of the hardmask 206, the first dielectric material 302, and the second dielectric material 304, including dry or wet etching techniques. The etching techniques may be implemented using the sacrificial material 204 as an etch-stop layer.

Figure 5:
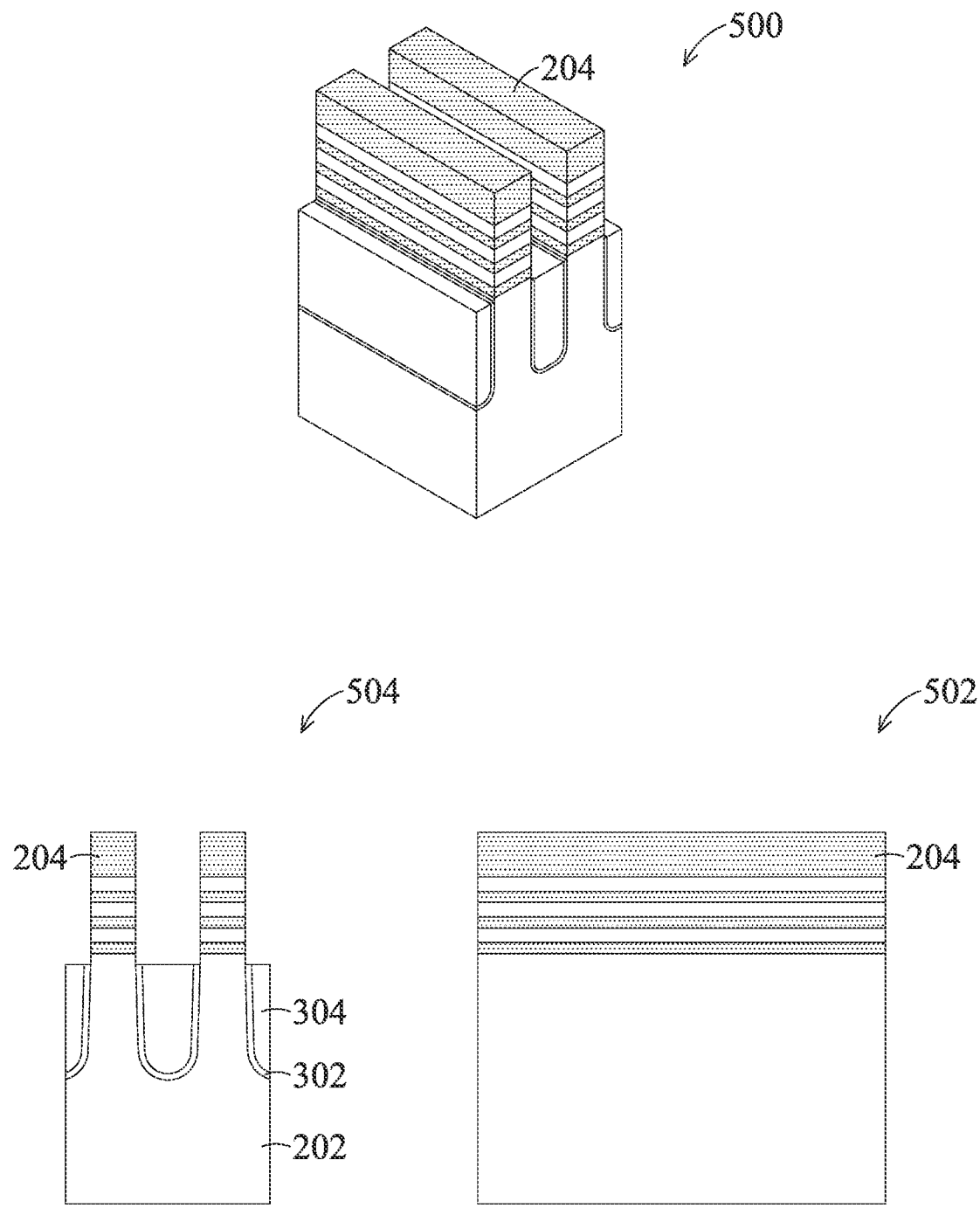

Still corresponding to operation 106 of FIG. 1, FIG. 5 shows a perspective view 500 and cross-sectional views 502 and 504 of the stack of layers following an etching process to remove portions of the first dielectric material 302 and the second dielectric material 304. As shown, the selective etching process is selective to the first dielectric material 302 and the second dielectric material 304, and does not remove the sacrificial material 204 or the substrate material 202. The etching process can be performed until the lower-most layer of the sacrificial material 204 is exposed, along with a small portion of the substrate material 202 below the lower-most layer of the sacrificial material 204. Any type of suitable etchant or material removal process may be used that is selective to the second dielectric material 304 and/or the first dielectric material 302. In some embodiments, two etching steps may be performed, one that is selective to the second dielectric material 304, and a second that is selective to the first dielectric material 302.

Figure 6:
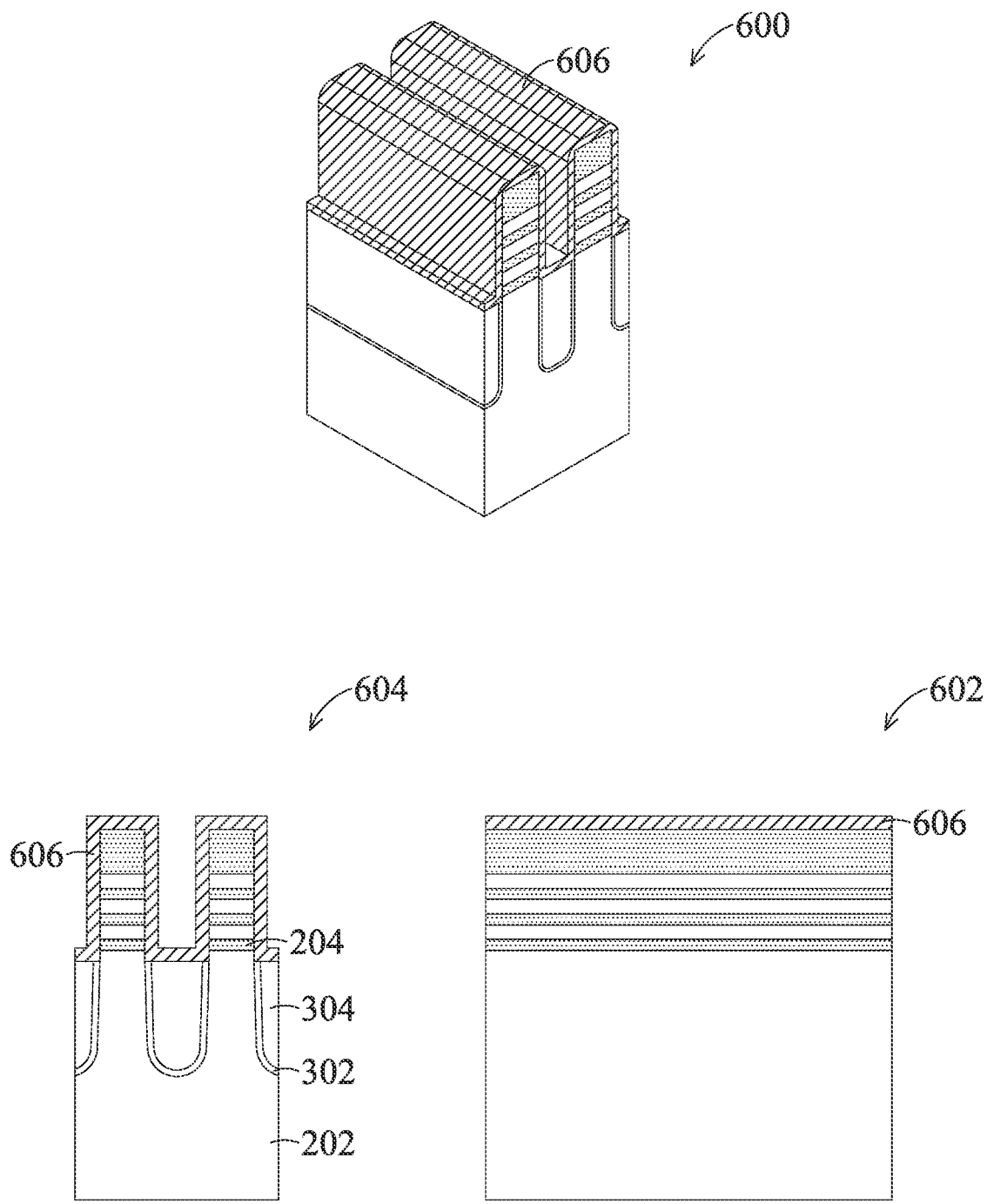

Corresponding to operation 108 of FIG. 1, FIG. 6 shows a perspective view 600 and cross-sectional views 602 and 604 of the stack of layers following deposition of a second sacrificial material 606. The second sacrificial material 606 may be any type of suitable that may be deposited or epitaxially grown on the substrate material 202 or the sacrificial material 204. In some embodiments, the second sacrificial material 606 may be the same material as the sacrificial material 204, or may be a different material. The second sacrificial material 606 can be a semiconductor alloy material, such as SiGe or another suitable sacrificial material. The second sacrificial material 606 can be formed to encapsulate the top of the device, as shown in the perspective view 600 and the cross-sectional view 604. The sacrificial material 606 may be formed as a cladding layer over the device.

Figure 7:
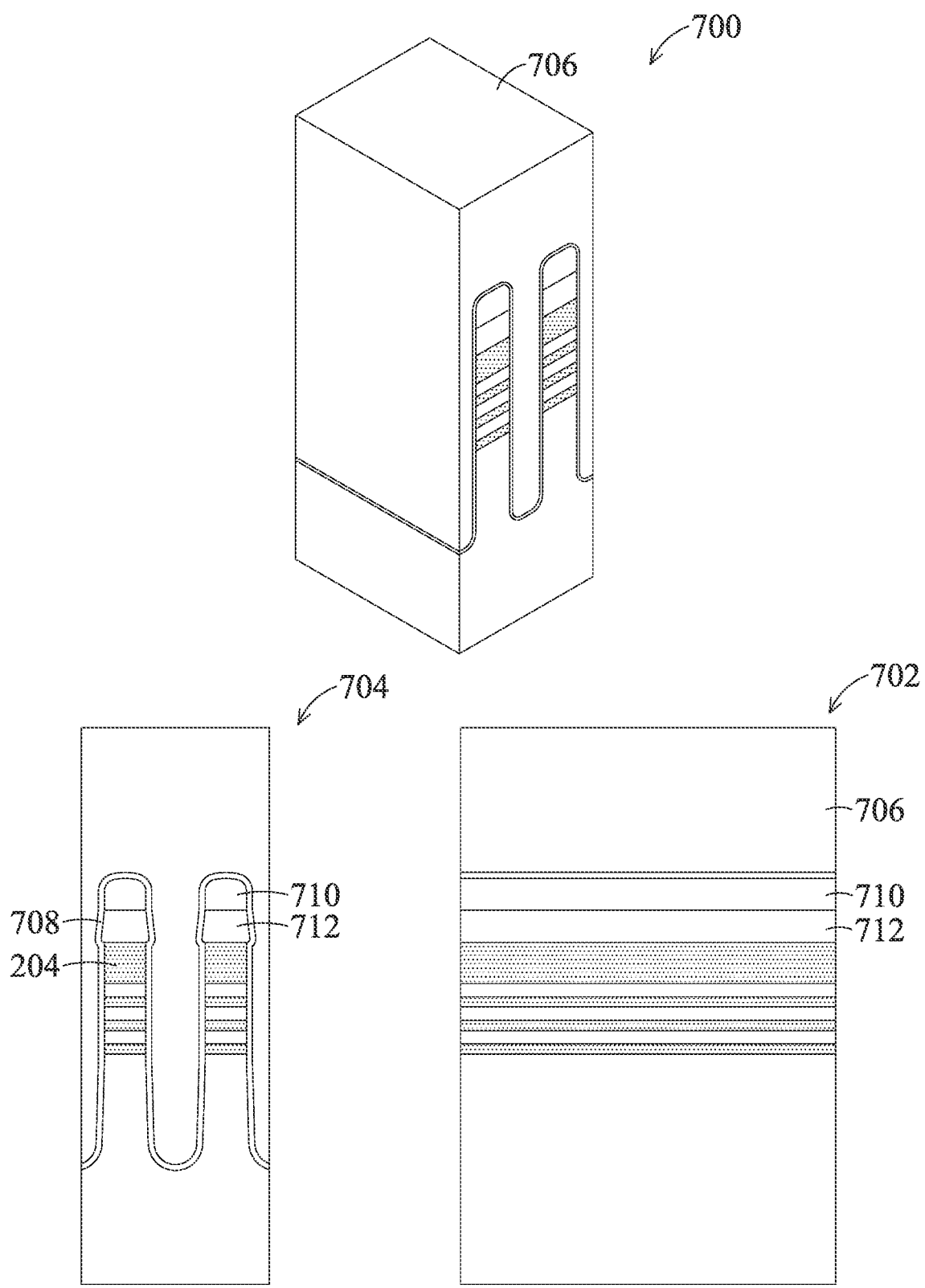

Corresponding to operation 110 of FIG. 1, FIG. 7 shows a perspective view 700 and cross-sectional views 702 and 704 of the stack of layers following formation of a first hardmask 712, a second hardmask 710, a liner material 708, and a third dielectric material 706. The liner material 708 can first be formed to cover the second sacrificial material 606, which is formed as a cladding layer. The liner material 708 can be deposited as a thin interface between the second sacrificial material 606 and the third dielectric material 706. The liner material 708 can be formed using any suitable material deposition process, and may include materials such as SiCN. After depositing the liner material 708, a first hardmask 712 can be formed on liner material 708 over the top layer of the sacrificial material 204. The first hardmask 712 can be any suitable hardmask material, such as SiN, and can be patterned and formed using any suitable material deposition technique. The second hardmask 710 can be patterned or selectively deposited on top of the first hardmask 712. The second hardmask 710 may be a different material than the first hardmask 712, such as an oxide material (e.g., SiOx). After forming the first hardmask 712 and the second hardmask 710, an additional layer of the liner material 708 can be formed using similar techniques to those described above. Next, a third dielectric material 706 can be formed on top of the liner material 708. The third dielectric material 706 can be formed using techniques similar to those used to form the second dielectric material 304 described in connection with FIG. 3. In some embodiments, the third dielectric material 706 can be the same material as the second dielectric material 304.

Figure 8:
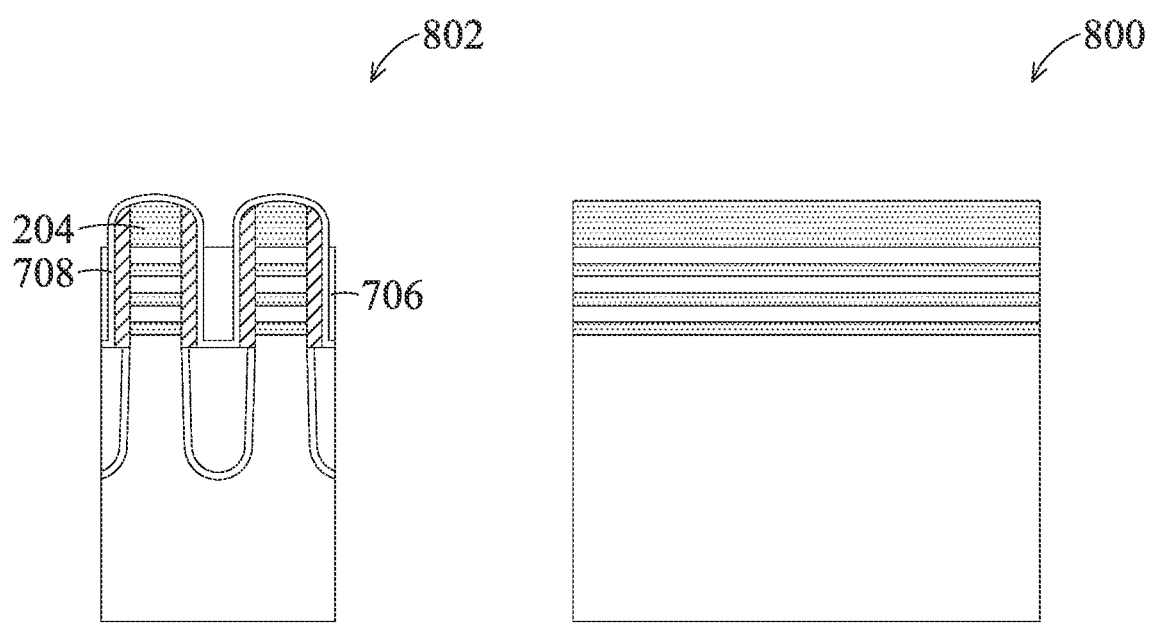
Figure 9:
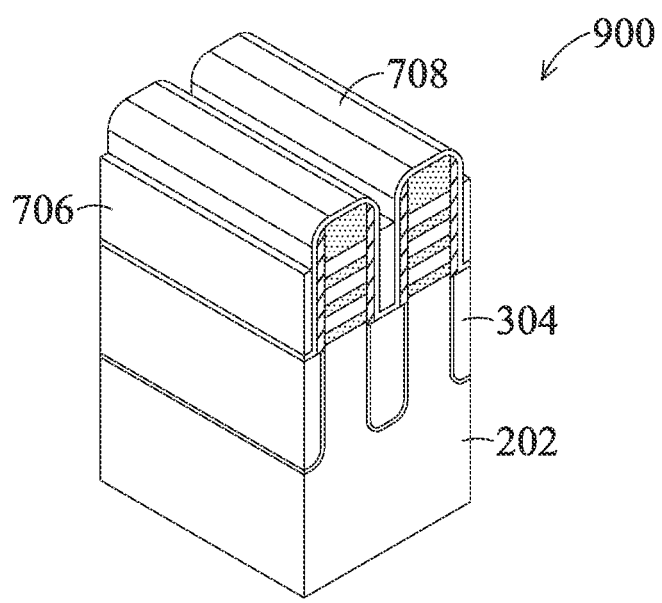

Corresponding to operation 112 of FIG. 1, FIG. 8 shows a cross-sectional views 800 and 808 of the stack of layers following an etching process that removes the first hardmask 712, the second hardmask 710, and the third dielectric material 706. FIG. 9 shows a perspective view 900 of the stack of layers following the same etching process. As shown in the cross-sectional view 800, the first hardmask 712 and the second hardmask 710 have been removed, along with the upper portion of the third dielectric material 706. This exposes an upper portion of the liner material 708. Any suitable etching processes, including dry or wet etching processes, can be used to remove the aforementioned materials. As shown in the cross-sectional view 802, the third dielectric material 706 can be etched until it is above level with the bottom of the top layer of the sacrificial material 204.

Figure 10:
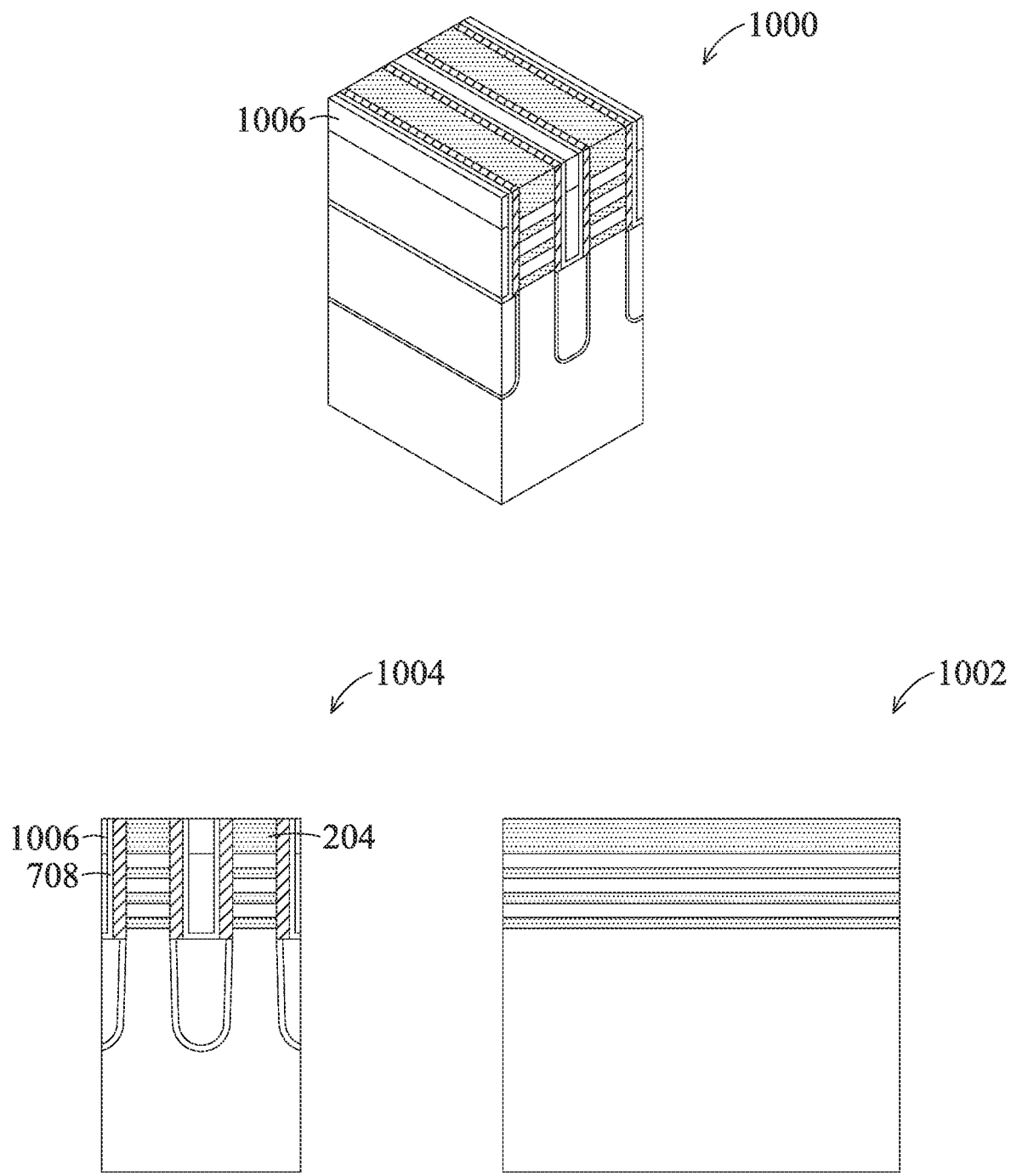

Corresponding to operation 114 of FIG. 1, FIG. 10 shows a perspective view 1000 and cross-sectional views 1002 and 1004 of the stack of layers following formation of a high-k dielectric material 1006. The high-k dielectric material 1006 can be an insulating material with a relative large dielectric constant, k. The high-k dielectric material 1006 may include oxide materials or other insulating materials. The high-k dielectric material 1006 can be formed using any suitable material deposition technique, such as chemical vapor deposition (CVD), physical vapor deposition (PVD), ALD, or other suitable processes. After forming the high-k dielectric material 1006, a CMP process can be performed to planarize the device. This can also remove an upper portion of the liner material 708, and expose the upper layer of the sacrificial material 204. As shown, the sacrificial material 204 is level with the high-k dielectric material 1006 following the CMP process.

Figure 11:
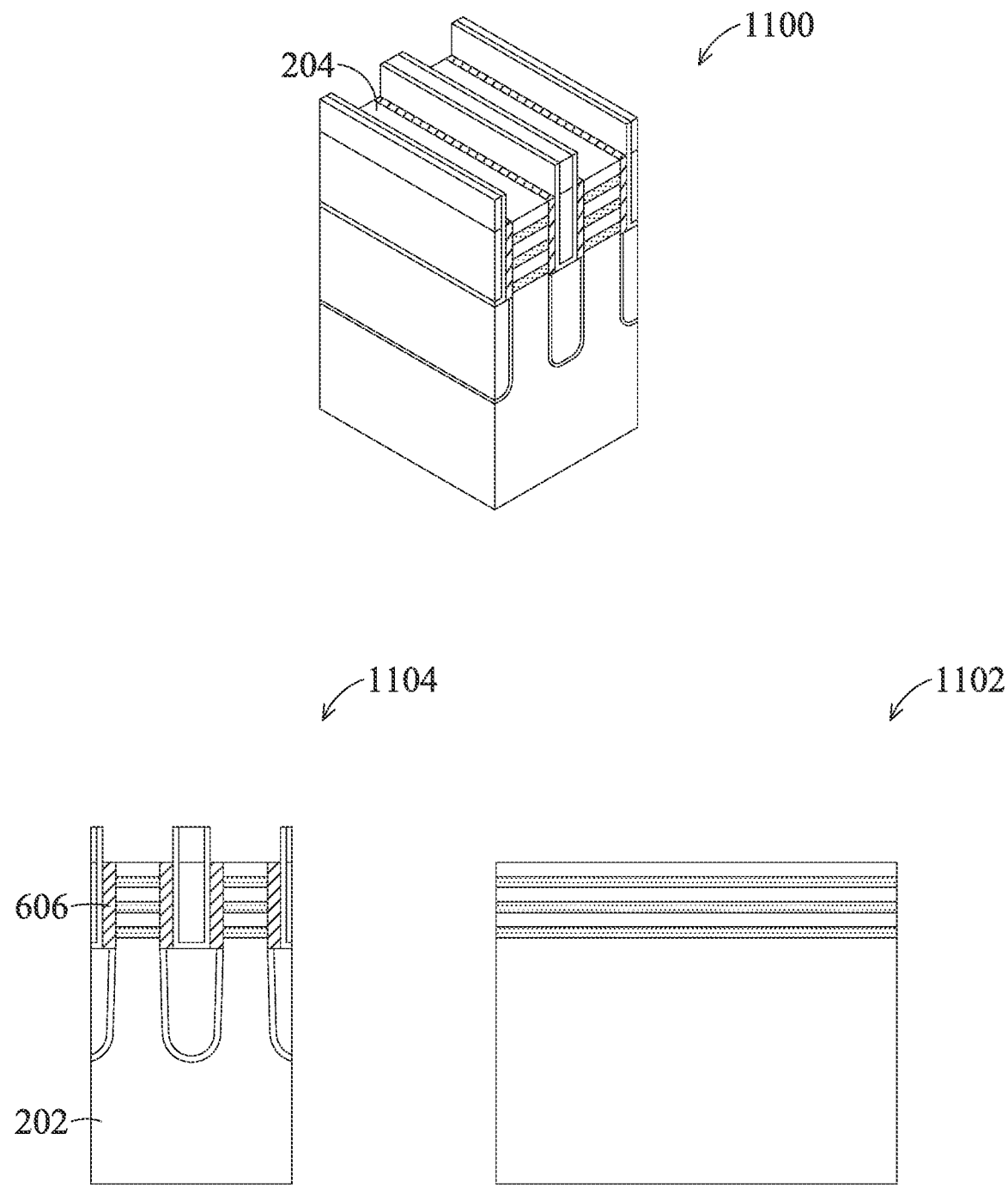

Corresponding to operation 116 of FIG. 1, FIG. 11 shows a perspective view 1100 and cross-sectional views 1102 and 1104 of the stack of layers following a selective etching process. As shown in the perspective view 1100 and the cross-sectional view 1104, the etching process can remove the top layer of the sacrificial material 204. The perspective view 1100 shows a very thin layer of the sacrificial material 204 remains on top of the substrate material 202. Additionally, the etching process can remove an upper portion of the second sacrificial material 606. The etching process used may be selective to both the sacrificial material 204 and the second sacrificial material 606. In some embodiments, multiple selective etching processes may be used to remove the upper portions of the sacrificial material 204 and the second sacrificial material 606. As shown, the second sacrificial material 606 can be etched until level with the top layer of the substrate material 202.

Figure 12:
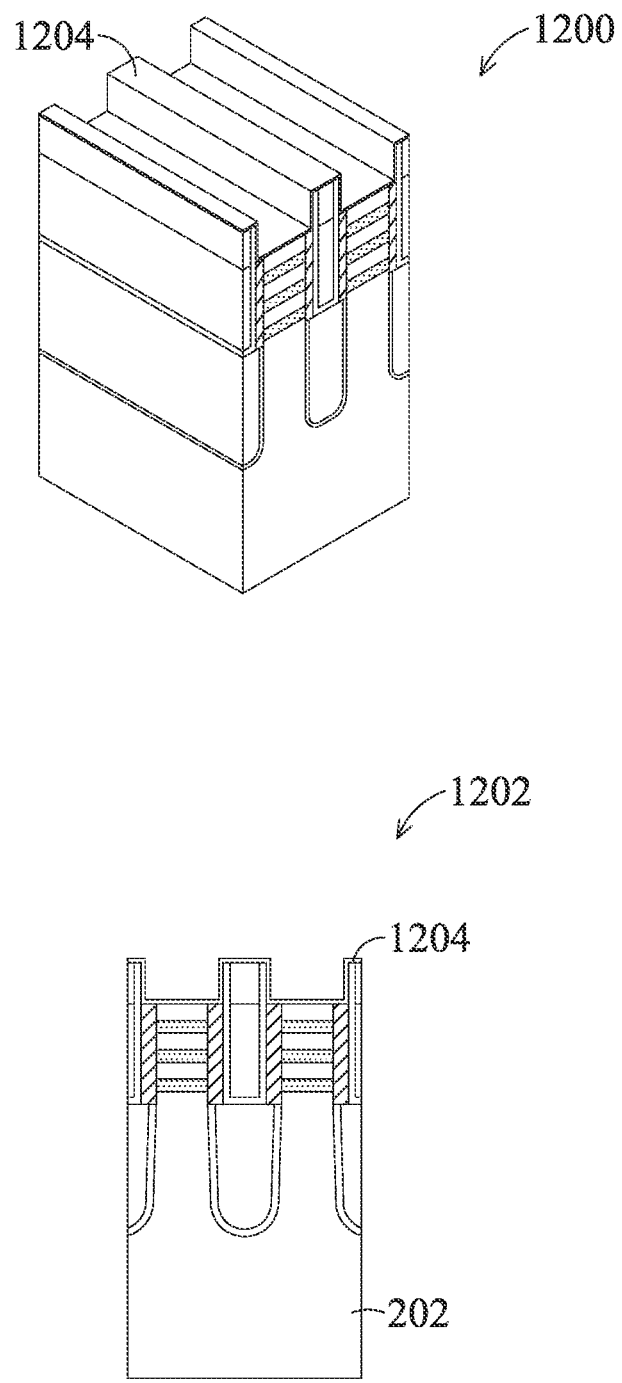

Corresponding to operation 118 of FIG. 1, FIG. 12 shows a perspective view 1200 and a cross-sectional views 1202 of the stack of layers following the deposition of a fourth dielectric material 1204. The fourth dielectric material 1204 can be formed as a thin layer over the top of the device. The fourth dielectric material 1204 can be any type of suitable insulating material, such as an oxide material. The fourth dielectric material 1204 can be formed using any type of suitable material deposition technique, such as CVD, PVD, ALD, or other suitable processes. The fourth dielectric material 1204 can electrically isolate the substrate material 202 from additional material layers added in future process steps. As shown in the perspective view 1200, the fourth dielectric material 1204 can cover the entirety of the top of the device.

Figure 13:
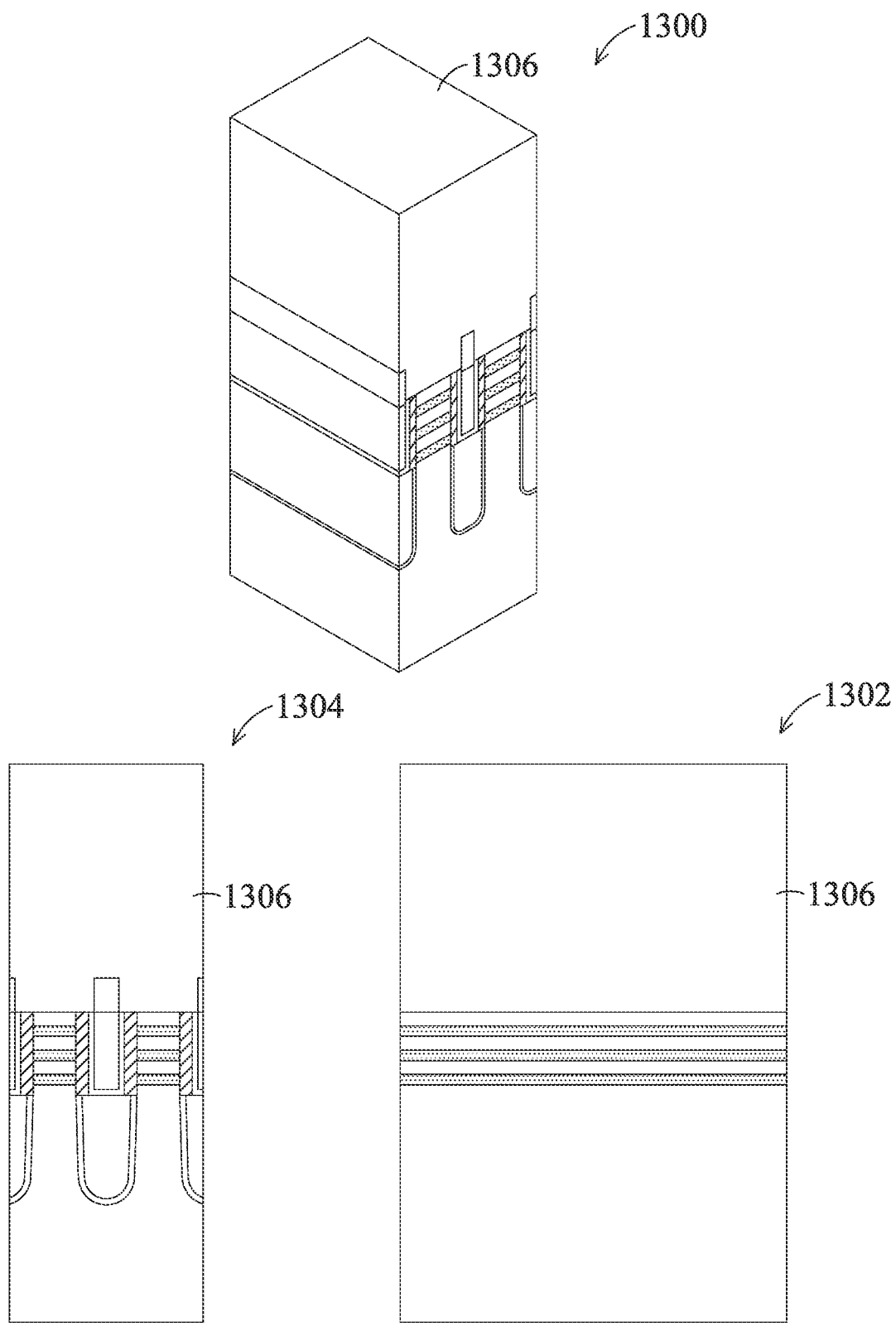

Corresponding to operation 120 of FIG. 1, FIG. 13 shows a perspective view 1300 and cross-sectional views 1302 and 1304 of the stack of layers following the deposition of a PO material 1306. As shown, the PO material 1306 covers the entirety of the device, and is deposited on the fourth dielectric material 1204 described in connection with FIG. 12. The PO material 1306 can be, for example, a polysilicon material. The PO material 1306 can be used as a placeholder region, which will be removed in later process steps to form metal gate materials. The PO material 1306 can be deposited using any suitable material deposition technique, including ALD, CVD, PVD, among other techniques. PO material 1306 can be deposited to a predetermined thickness, according to design parameters of the device.

Figure 14:
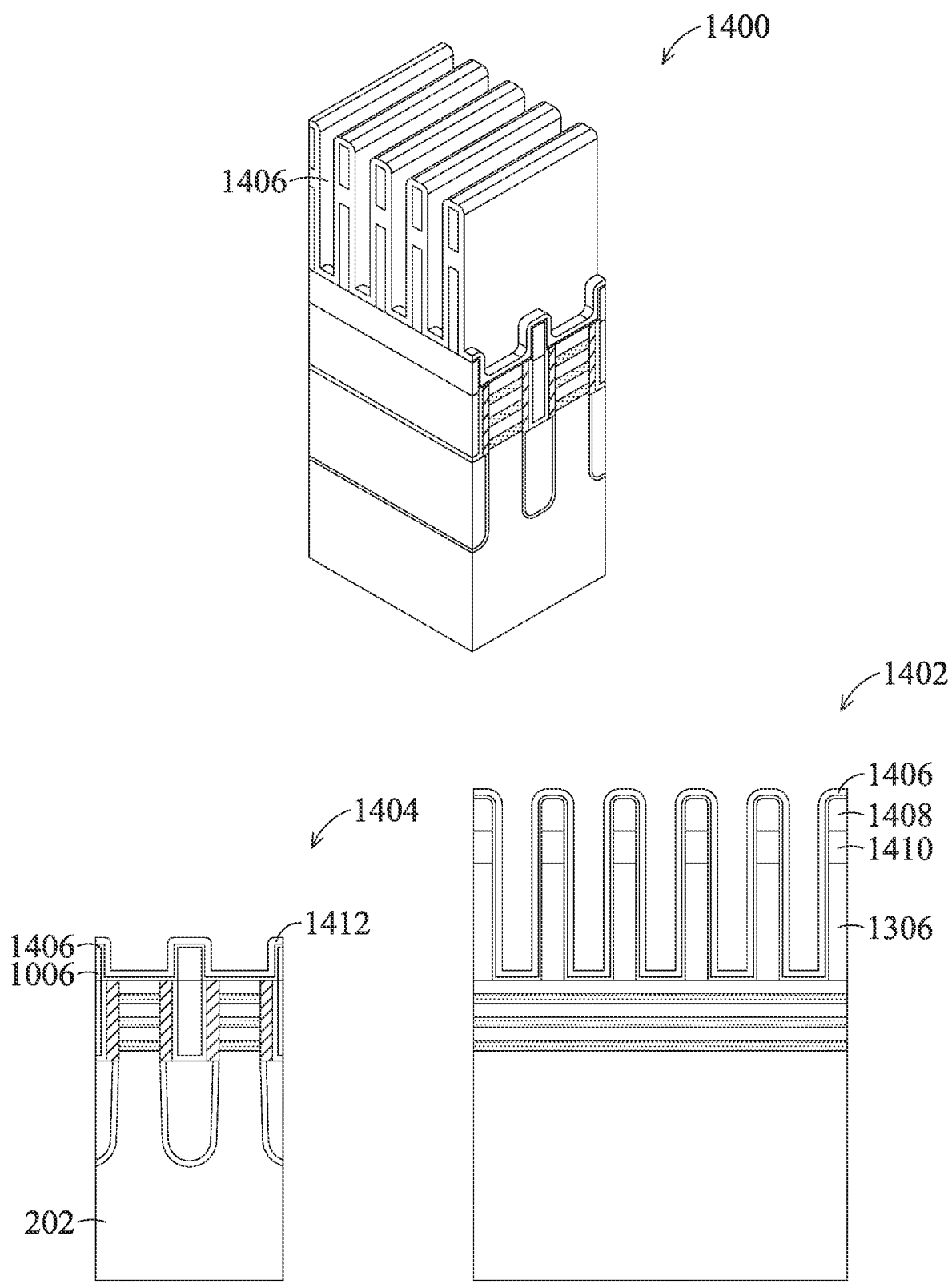

Corresponding to operation 122 of FIG. 1, FIG. 14 shows a perspective view 1400 and cross-sectional views 1402 and 1404 of the stack of layers following the patterning and etching the of the PO material 1306. To etch the PO material 1306, a third hardmask 1410 and a fourth hardmask 1408 can first be patterned on top of the PO material 1306. The third hardmask 1410 and the fourth hardmask 1408 can be patterned, for example, using a photo resist material, such that the third hardmask 1410 and the fourth hardmask 1408 form strips that are perpendicular to the fin structures formed from the sacrificial material 204 and the substrate material 202. The third hardmask 1410 and the fourth hardmask 1408 can be similar to the first hardmask 712 and the second hardmask 710 described in connection with FIG. 7, and can be made from similar materials and formed using similar techniques. After depositing the third hardmask 1410 and the fourth hardmask 1408, the PO material 1306 can be selectively and vertically etched, such that the PO material 1306 below the third hardmask 1410 and the fourth hardmask 1408 are not removed by the etching process. Any suitable vertical etching process or material removal process can be used.

After etching the PO material 1306, a layer of a second liner material 1412 can be deposited over the top of the device, covering the PO material 1306, the third hardmask 1410 and the fourth hardmask 1408, the substrate material 202, and the high-k dielectric material 1006. The second liner material 1412 can be similar to the liner material 708 described in connection with FIG. 7. The second liner material 1412 can be any type of suitable insulating material, such as an oxide or another type of insulator. After depositing the second liner material 1412, a layer of a spacer material 1406 is deposited over the device. As shown, the layer of the spacer material evenly covers all materials on the surface of the device. The spacer material 1406 can be deposited using any suitable material deposition technique, such as ALD, CVD, PVD, among others. The spacer material can be used to protect materials on the device from etching processes in further process steps.

Figure 15:
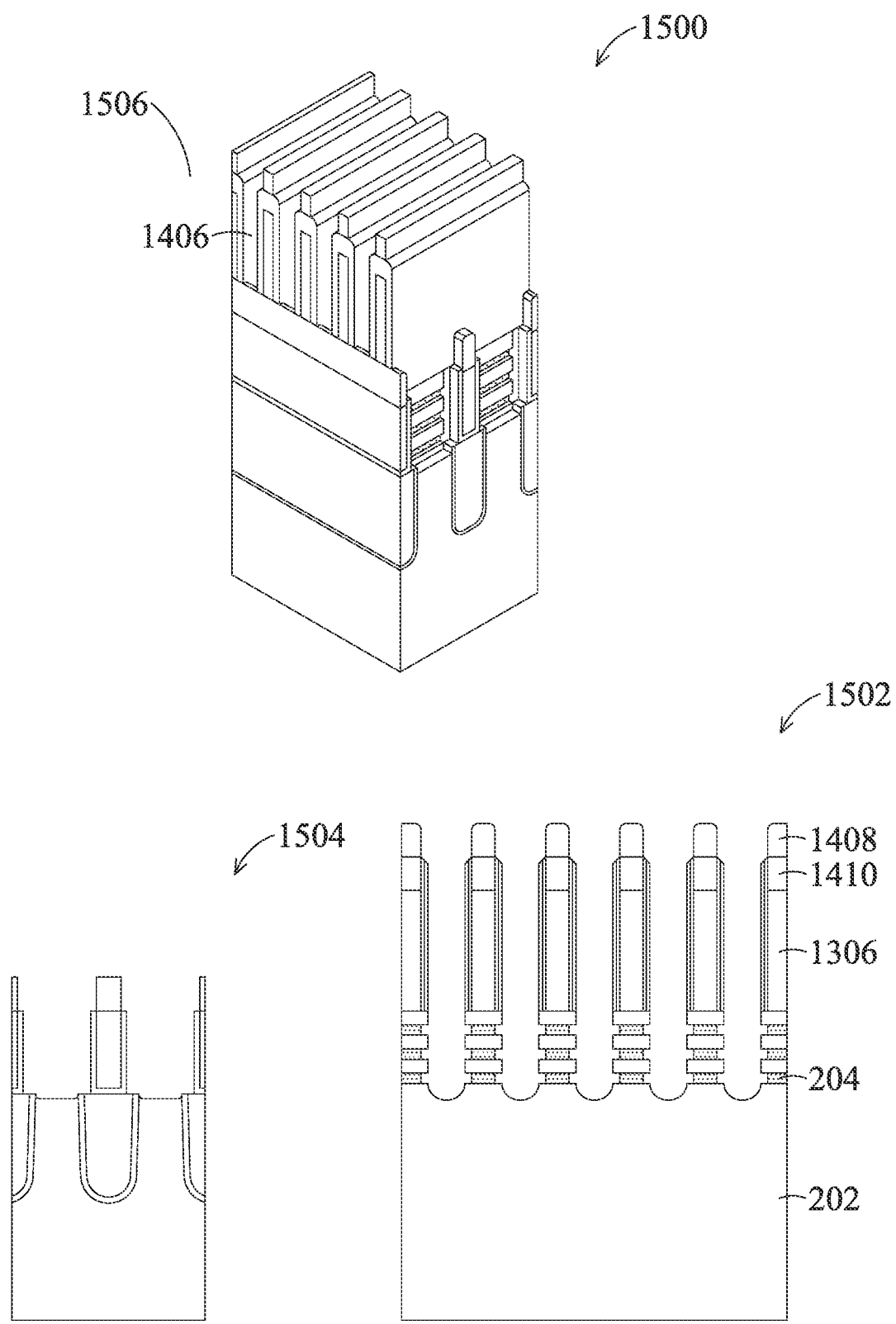

Corresponding to operation 124 of FIG. 1, FIG. 15 shows a perspective view 1500 and cross-sectional views 1502 and 1504 of the stack of layers following a vertical etching process. As shown, the materials added in the previous process step are vertically etched to create a number of troughs in the substrate material 202 between the PO material 1306 structures. The vertically etching process can be performed to etch the substrate to below the bottom-most layer of the sacrificial material 204. As shown in the cross-sectional view 1502, the troughs are formed through the alternating layers of the substrate material 202 and the sacrificial material 204. The etching process causes the layers of the sacrificial material 204 to be recessed relative to the sides of the troughs. The third hardmask 1410, the fourth hardmask 1408, and the spacer material 1406 protect the PO material 1306 from the etching process, such that it remains intact following the etching process and defines the walls of each trough. Although some of the layers of the sacrificial material 204 are etched, portions of the sacrificial material 204 remain under each PO material 1306 structure.

Figure 16:
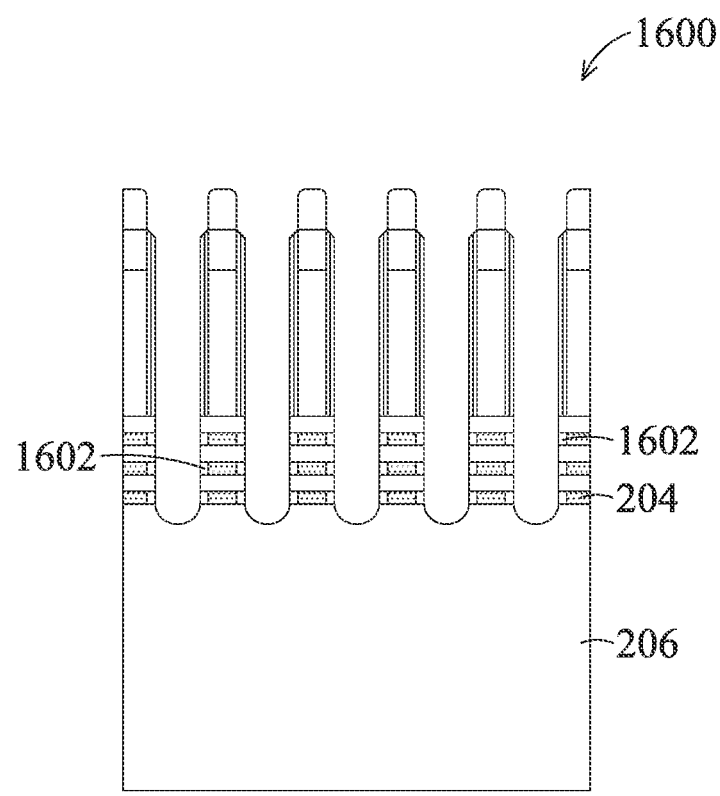

Corresponding to operation 126 of FIG. 1, FIG. 16 shows a cross-sectional view 1600 of the stack of layers after forming spacers 1602 on the sacrificial material 204. As described above, the prior etching process caused the layers of the sacrificial material 204 making up portions of the walls of the troughs in the substrate material 202 to become recessed slightly. The spacers 1602 can be formed in air gaps between the layers of the substrate material 202, which were created when recessing the sacrificial material 204. The spacers 1602 can be formed from any type of suitable insulating material with a relatively low dielectric constant k, such as silicon oxide, silicon oxycarbonitride (SiOCN), or the like. Any suitable deposition method, such as thermal oxidation, CVD, or the like, may be used to form the spacers 1602. The shapes and formation methods of the spacers 1602 as illustrated in FIG. 16 are merely non-limiting examples, and other shapes and formation methods are possible. These and other variations are fully intended to be included within the scope of the present disclosure.

Figure 17:
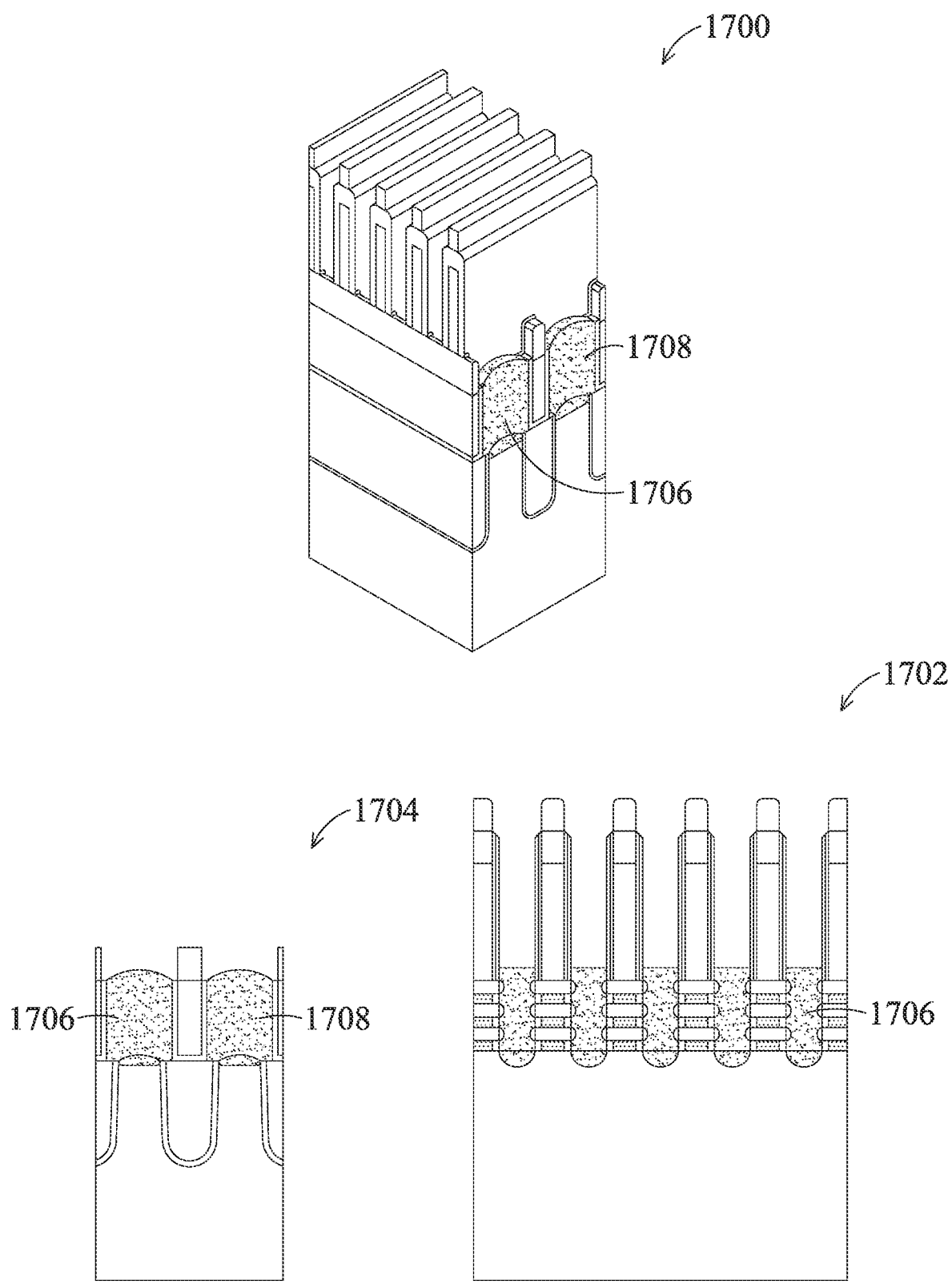

Corresponding to operation 128 of FIG. 1, FIG. 17 shows a perspective view 1700 and cross-sectional views 1702 and 1704 of the stack of layers following epitaxial growth of a first doped semiconductor material 1706 and a second doped semiconductor material 1708. Each of the first doped semiconductor material 1706 and the second doped semiconductor material 1708 can be epitaxially grown using the substrate 202 as a seed material in the troughs formed in previous etching steps. To form each of first doped semiconductor material 1706 and the second doped semiconductor material 1708, selective patterning may be performed to guide the epitaxial growth of the first doped semiconductor material 1706 and the second doped semiconductor material 1708 in respective regions of each trough. For example, a dielectric material (not shown) or other masking material may be used to prevent epitaxial growth on some regions of the substrate material 202, allowing for selective growth of both P-type and N-type semiconductive material.

The first doped semiconductor material 1706 and the second doped semiconductor material 1708 may be doped to have the same or a different polarity. The first doped semiconductor material 1706 and the second doped semiconductor material 1708 may have an impurity (e.g., dopant) concentration in a range from about $1 \times 10^{19}$ cm$^{-3}$ to about $1 \times 10^{21}$ cm$^{-3}$. P-type impurities, such as boron or indium, or N-type impurities, such as phosphorous or arsenide, may be implanted in the first doped semiconductor material 1706 or the second doped semiconductor material 1708. In some embodiments, the first doped semiconductor material 1706 and the second doped semiconductor material 1708 may be in situ doped during their growth.

Figure 18:
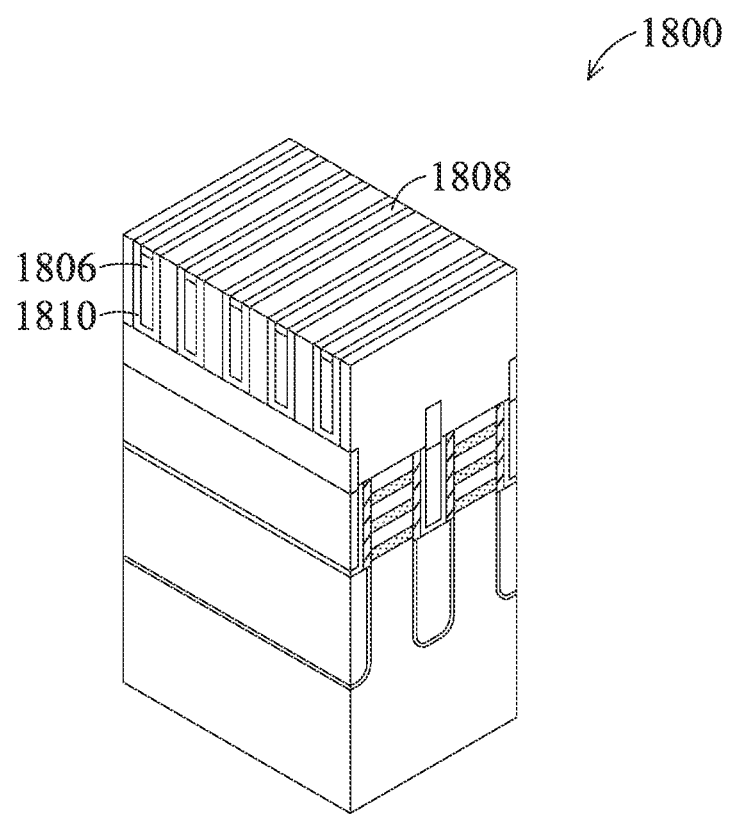
Figure 19:
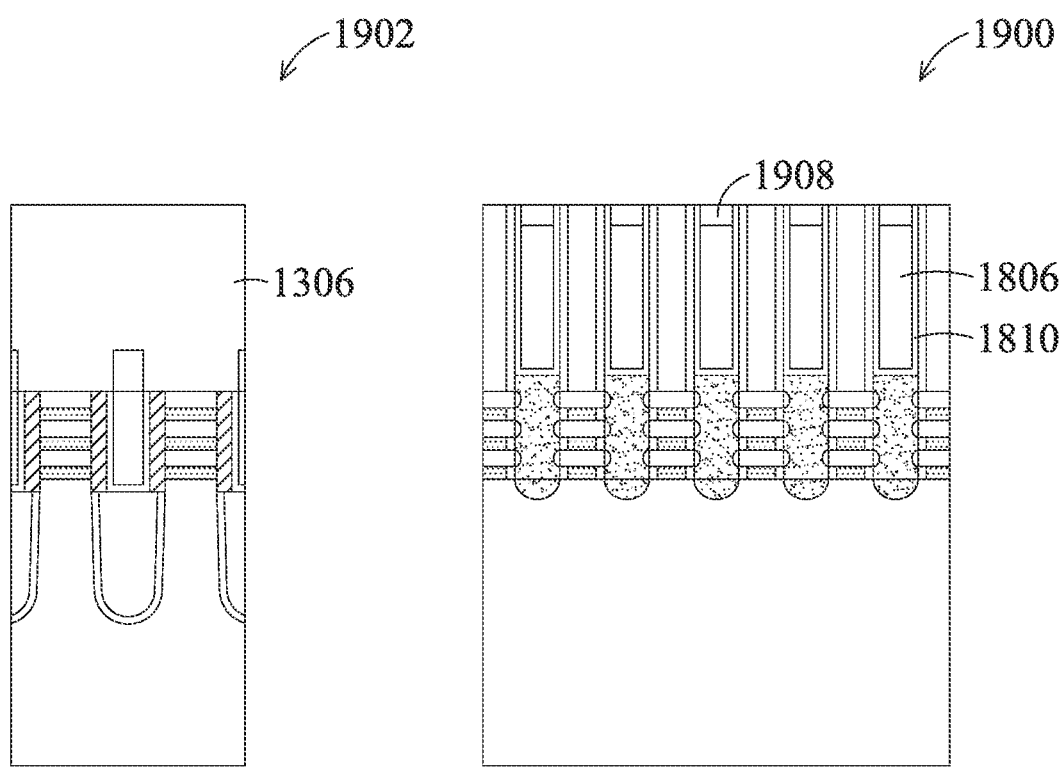

Corresponding to operation 130 of FIG. 1, FIGS. 18 and 19 show a perspective view 1800 and cross-sectional views 1900 and 1902 of the stack of layers following the deposition of a CESL material 1810, an ILD material 1806, and a dielectric layer 1808. First, a CESL material 1810 is formed over the first doped semiconductor material 1706 and the second doped semiconductor material 1708. The CESL material 1810 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD material 1806 is formed over the CESL material 1810. In some embodiments, the ILD material 1806 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD material 1806 is formed, an optional dielectric layer 1808 is formed over the ILD material 1806. The dielectric layer 1808 can function as a protection layer to prevent or reduces the loss of the ILD material 1806 in subsequent etching processes. The dielectric layer 1808 may be formed of a suitable material, such as silicon nitride, silicon carbonitride, or the like, using a suitable method such as CVD, PECVD, or FCVD. After the dielectric layer 1808 is formed, a planarization process, such as a CMP process, may be performed to achieve a level upper surface for the dielectric layer. The CMP may also remove the third hardmask 1410 and the fourth hardmask 1408 and portions of the CESL material 1810. After the planarization process, the upper surface of the dielectric layer 1808 is level with the upper surface of the PO material 1306, in some embodiments.

Figure 20:
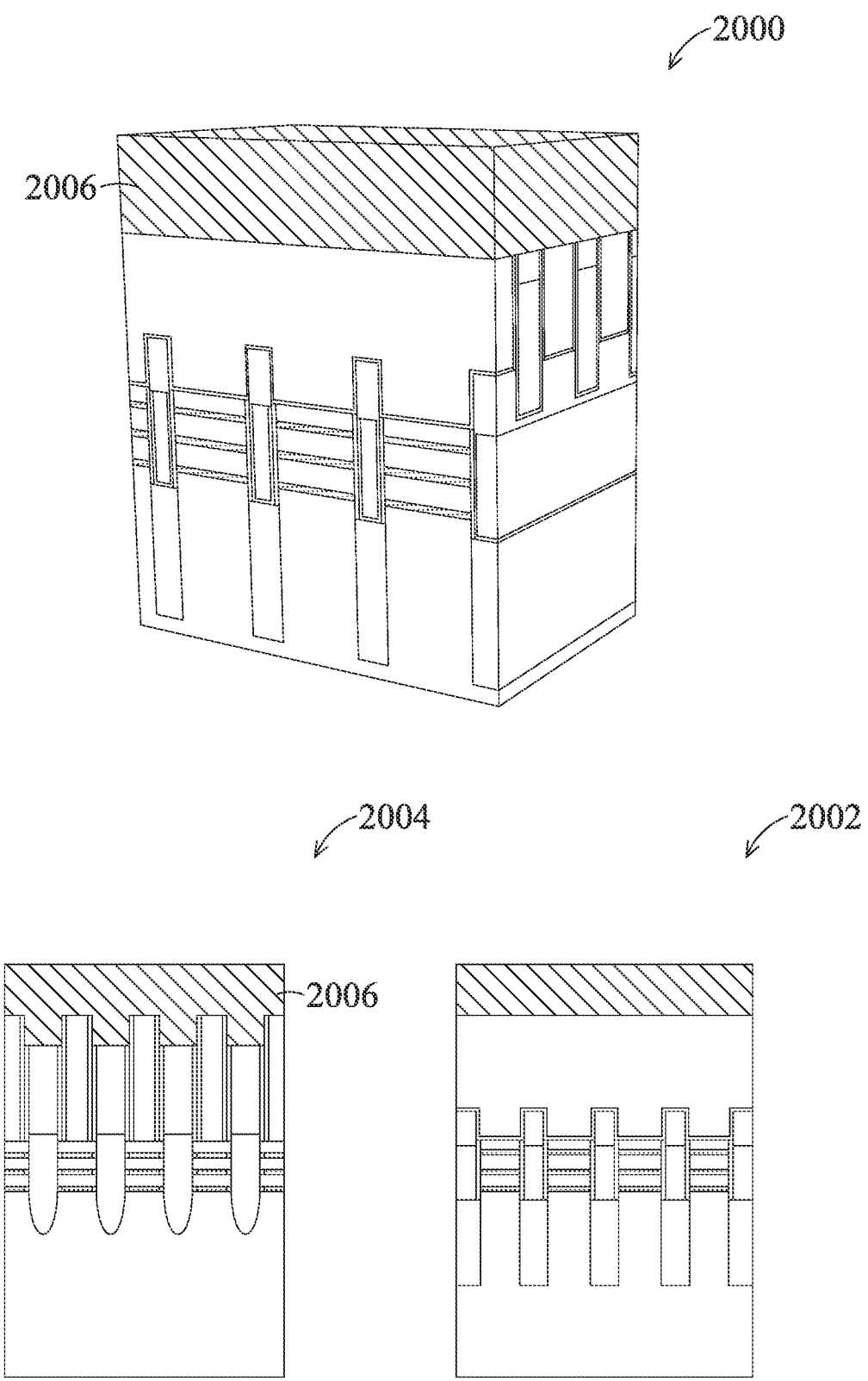

Corresponding to operation 132 of FIG. 1, FIG. 20 shows a perspective view 2000 and cross-sectional views 2002 and 2004 of the stack of layers at the start of a CPODE process. At the start of the CPODE process, a hardmask layer 2006 can be deposited over the surface of the device. The hardmask layer 2006 can be any type of suitable dielectric material, including as silicon nitride, silicon carbonitride, or the like, and may be formed using a suitable method such as CVD, PECVD, or FCVD. After the hardmask layer 2006 is formed, a planarization process, such as a CMP process, may be performed.

Figure 21:
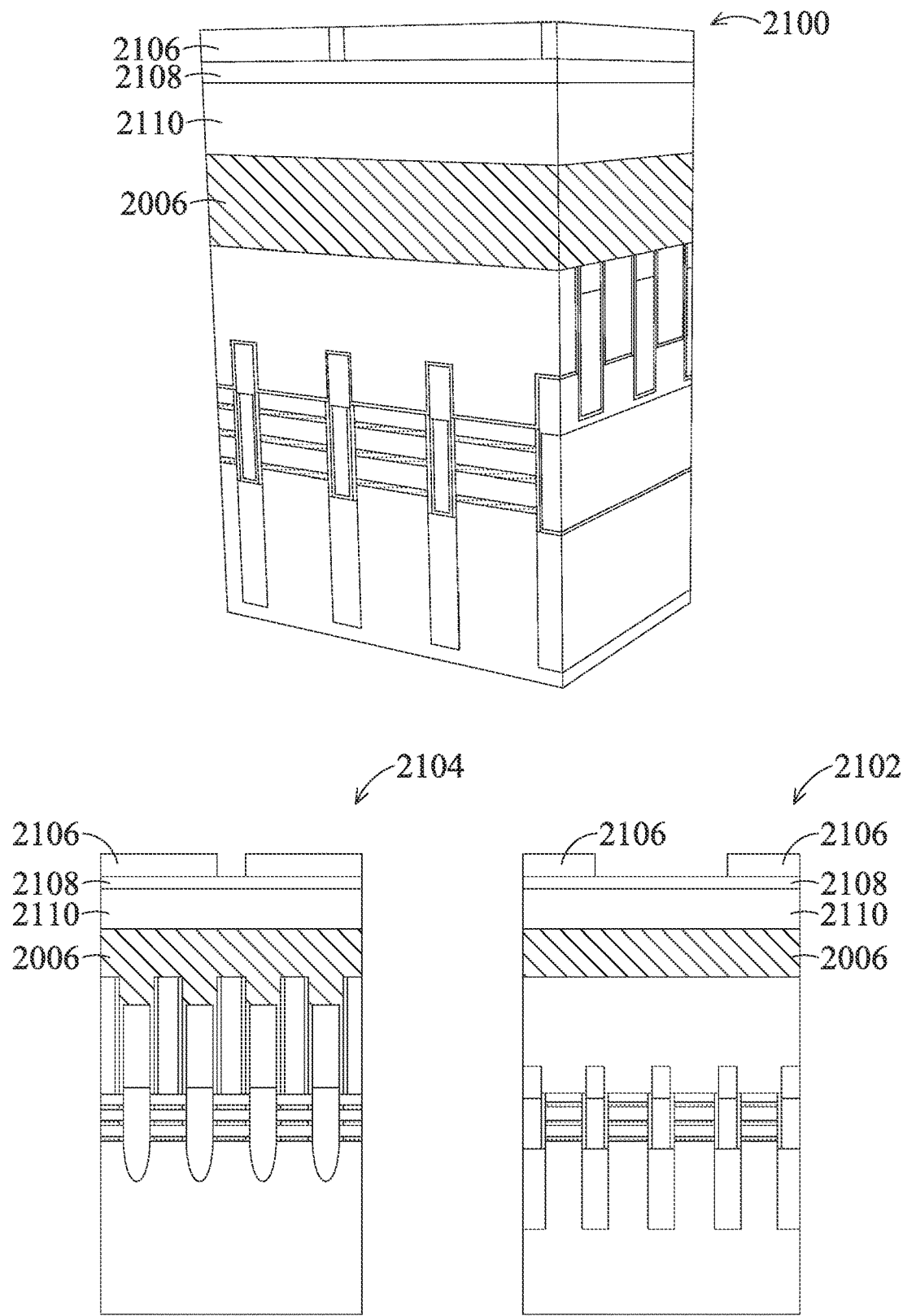

Still corresponding to operation 132 of FIG. 1, FIG. 21 shows a perspective view 2100 and cross-sectional views 2102 and 2104 of the stack of layers undergoing a CPODE process. As shown, a second hardmask layer 2110 and a third hardmask layer 2108 are formed on top of the hardmask layer 2006, followed by a layer of patterned photoresist 2106. Indeed, and number of additional hard mask layers can be formed over the hardmask layer 2006 of FIG. 20. As shown, the patterned photoresist includes a slot-shaped opening, which is positioned to guide further etching processes. To pattern the photoresist 2106, the photoresist 2106 is deposited, irradiated (exposed), and developed to remove predetermined portions of the photoresist 2106. The remaining photoresist 2106 protects the underlying layers from subsequent processing steps, such as etching.

Figure 22:
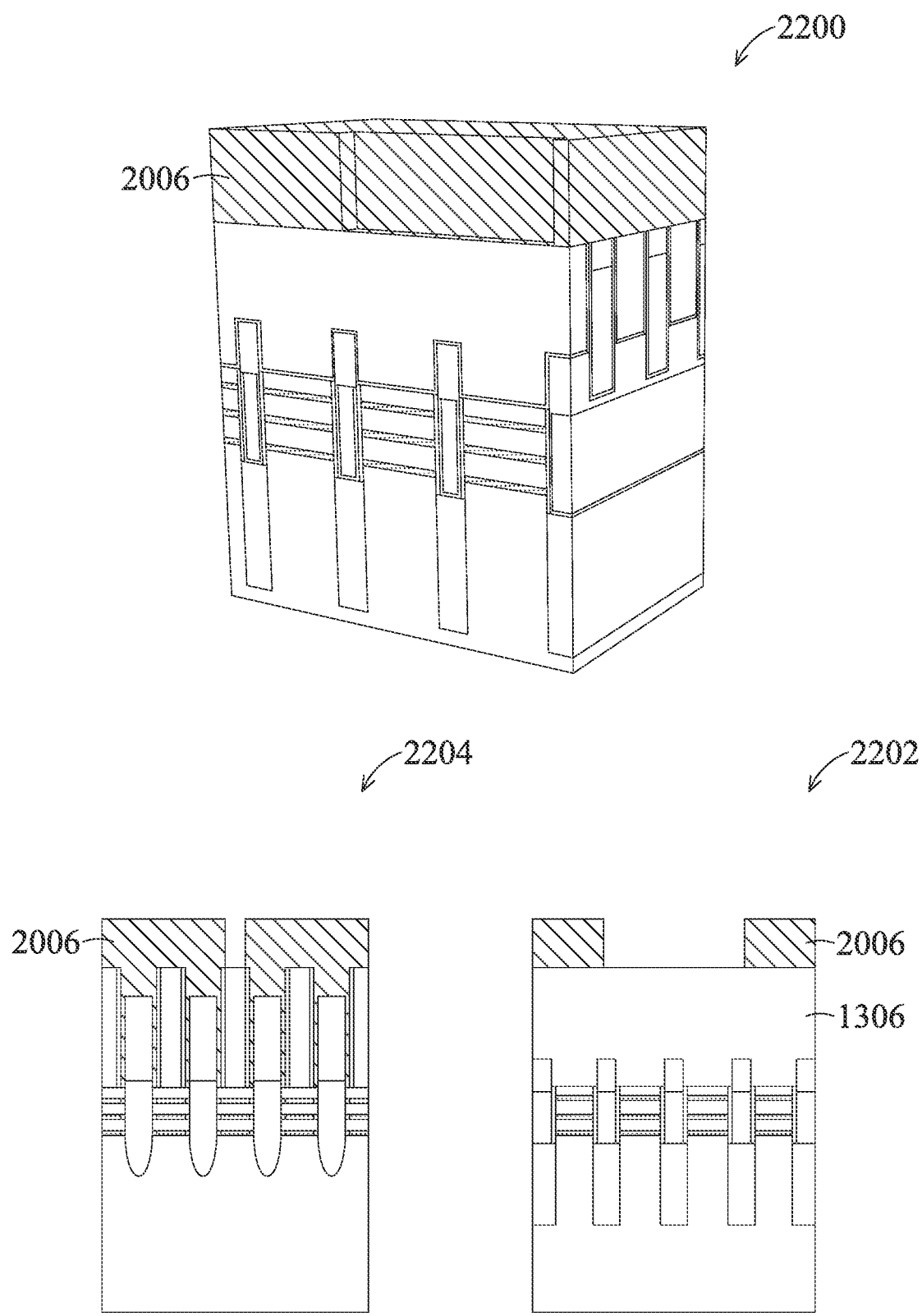

Corresponding to operation 134 of FIG. 1, FIG. 22 shows a perspective view 2200 and cross-sectional views 2202 and 2204 of the stack of layers undergoing the CPODE process to isolate one or more transistor structures that will be formed in the stack of layers. As shown, using suitable etching processes, each of the photoresist 2106, the second hardmask layer 2110, and the third hardmask layer 2108 have been removed, along with a slot-shaped portion of the hardmask layer 2006. For example, a slot-shaped portion of the third hardmask layer 2108 can be removed, wherein a remaining portion of the third hardmask layer 2108 can be protected by the photoresist. In some embodiments, the slot-shaped portion can extend through additional hard mask layers such as the second hardmask layer 2110 or the hardmask layer 2006. The photoresist can be stripped whereby the second hardmask layer 2110 or the third hardmask layer 2108 can be removed (e.g., using the first hardmask layer or the PO material 1306 as an etch stop). As shown, the slot-shaped portion that is removed from the hardmask layer 2006 was previously defined by the corresponding opening in the photoresist 2106. The etching process can be a vertical etching process towards the PO material 1306, with the PO material 1306 serving as an etch stop layer.

Figure 23:
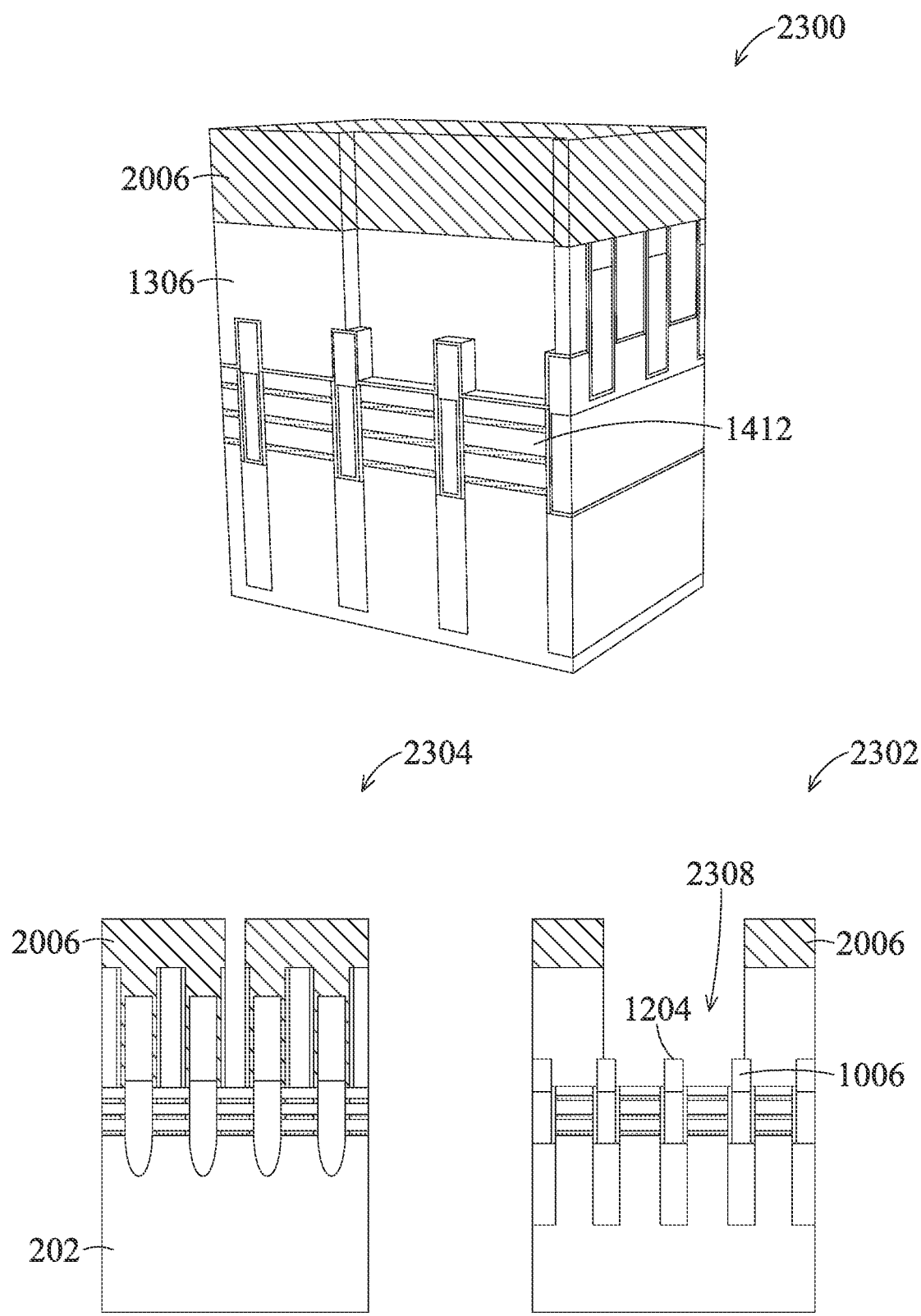

Still corresponding to operation 134 of FIG. 1, FIG. 23 shows a perspective view 2300 and cross-sectional views 2302 and 2304 of the stack of layers undergoing the CPODE process. An additional vertical etching process in the direction towards the substrate 202 is performed to remove a portion of material disposed along a surface of the semiconductor device. For example, at least a portion of the hardmask layer 2006 can be removed from the semiconductor device (e.g., prior to or as a portion of operation 134). A break-through etch process can be used to break through the a hardmask such as the hardmask layer 2006. In some embodiments, the break-through process may be selective as to etch one or more hardmask layers, without etching the PO material 1306. Various break through processes can be employed. For example, a methane (e.g., fluorinated methane) based breakthrough process and/or argon based breakthrough process can include a flow rate of about 100 standard cubic centimeters per minute (SCCM). The flow rate can vary according to a process details. For example, in some embodiments, flow rates of 5 SCCM, 50 SCCM, or 500 SCCM may be employed.

The etching operation can form a PO opening 2308 which may be based on the slot-shaped opening formed in the photoresist 2106 (and transferred to one or more hard mask layers). The etching operation can include any combination of a number of first main etching operations and a number of second main etching operations. Each of the main etching operations can include various sub-operations (e.g., stages of an etching process), each of which further comprises a plurality of etchants (e.g., dry etchants or wet etchants). The various etchants can be delivered to the semiconductor device individually, or in combination. For example, the etchants of a sub-operation can be applied in sequence, or as a mixture.

In some embodiments, operation 134 can include a first main etching operation with a number of sub-operations. A first sub-operation can include introducing one or more etchants such as silicon tetrachloride ($SiCl_4$), nitrogen (e.g., $N_2$), chlorine (e.g., $Cl_2$), or the like. For example, the etching process can etch the PO material 1306. One or more etchants can combine with the PO material 1306. For example, the nitrogen can combine with the PO material 1306 to form a silicon nitride hard mask along the sidewall of the opening. A second sub-operation can include an oxygen (e.g., $O_2$, $CO_2$, $SO_2$, etc.) flush to passivate the sidewall of the opening of the PO opening 2308. The oxygen flush can include an introduction of dioxygen. The oxygen can be introduced at a flow rate of between about 100 SCCM and 200 SCCM. A third sub-operation can include an argon sputtering process. For example, the argon sputtering process can remove material (e.g., polymer by-products) or further pacify materials within the PO opening 2308. The argon sputtering process can introduce a methane at a flow rate of up to about 100 SCCM, and argon at a rate of about 500 SCCM to 1000 SCCM. The argon sputtering process can remove materials such as oxidizers including oxygen, fluorine, and the like.

In some embodiments, operation 134 can include a second main etching operation with a number of sub-operations. A first sub-operation can include introducing etchants, such as oxygen (e.g., $O_2$ at a flow rate of up to about 50 SCCM), hydrogen bromide (e.g., HBr, at a flow rate of about 200 SCCM to about 1000 SCCM), and argon (e.g., at a flow rate of about 200 SCCM to 1000 SCCM). For example, the oxygen, hydrogen bromide, and argon can be introduced simultaneously as a plasma to directionally etch a semiconductor device. The second main etching operation can also include an argon sputtering process (as a second sub-operation), which may be similar to the argon sputtering process described above (e.g., may introduce a methane at a flow rate of up to about 100 SCCM and/or argon between about 500 SCCM and 1000 SCCM).

The various flow rates disclosed herein are not intended to be limiting. Indeed, the flow rate can vary according to a surface area, number of wafers to be processed, desired etching rate, minimum feature size, and numerous additional parameters as referred to herein or as known to those skilled in the art. Thus, while the disclosed ranges are illustrative of at least one embodiment, various embodiments can utilize various flow rates which may be within the ranges disclosed herein, in excess of the ranges disclosed herein, or less than the ranges disclosed herein. Various etchants (e.g., plasmas) can include additional, fewer, or substituted constituents. For example, the various flow rates noted as "up to" a value may be omitted (e.g., a flow rate of 0 SCCM may be selected).

Figure 24:
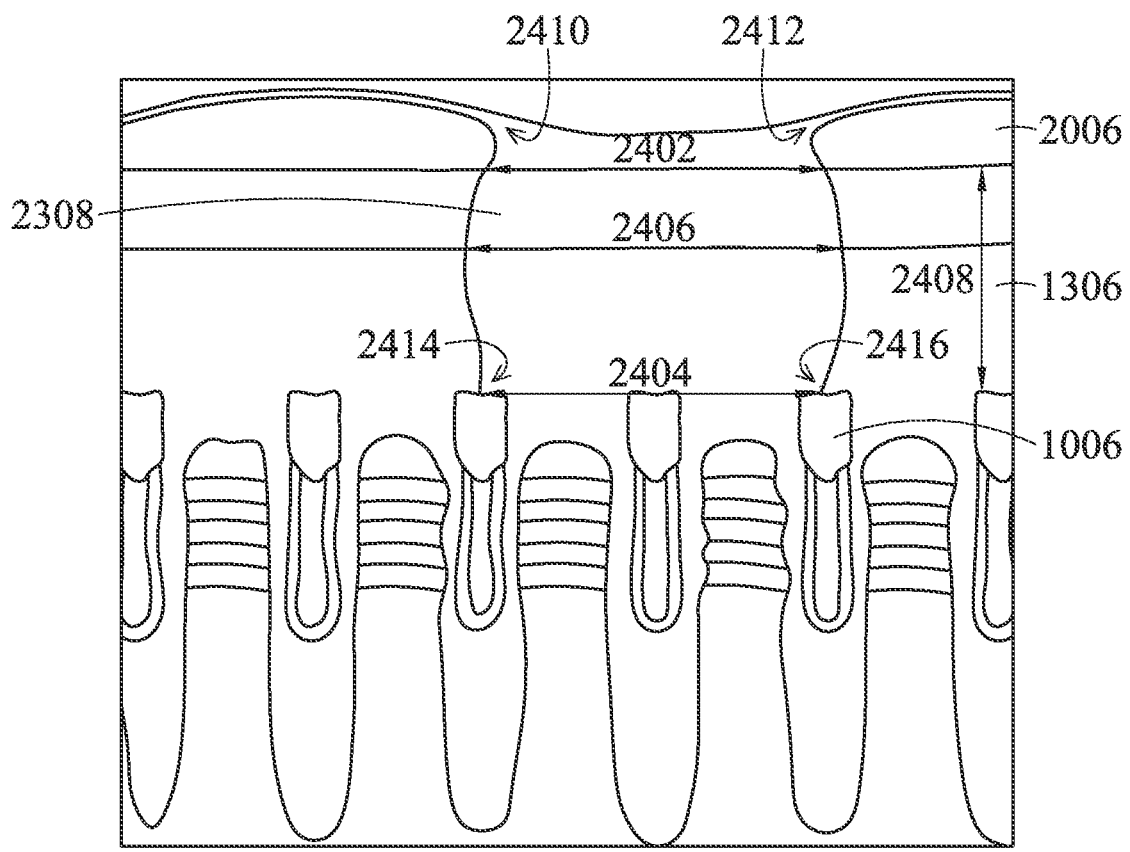

Referring now to FIG. 24, according to various embodiments, the various sub-operations of operation 134 can be alternated, repeated, etc. to form various CPODE PO opening 2308 profiles. An profile of the PO opening 2308 can be formed by completing operation 134. In various embodiments, profiles can be formed based on the inclusion, omission, substitution, flow rate, or cycle time of the various sub-operations of operation 134 (including the individual etchants thereof). Similarly, the PO opening 2308 profile can be defined by the time or flow rate of the argon sputtering process, or the cycle time or flow rates of the first main etching sub-operation. In various embodiments, sub-operations can be sequenced or repeated in order to form various profiles. For example, the PO opening 2308 depth can be formed by conducting any number of etching sub-operations, such as 3 or 4. The times, flow rates, and other parameters of each sub-operation can be selected to etch a defined depth of the PO material 1306 (e.g., can etch the same or different distance). The use of various sub-operations (e.g., relatively isotropic or relatively anisotropic operations, or sub-operations to passivate the sidewalls) can define the sidewall profile. For example, the irregular hexagonal profile depicted by FIG. 24 can be formed by excluding the oxygen flush sub-operation, and performing one or more cycles of the first main etching sub-operation and/or second main etching sub-operation.

A first upper lateral dimension 2402 of the PO opening 2308 is disposed along an upper surface of the semiconductor device, distal from the substrate. A first lower lateral dimension 2404 of the PO opening 2308 is disposed along a lower surface of the PO material 1306, proximate the substrate. A first medial lateral dimension 2406 is disposed between the first upper lateral dimension 2402 and the first lower lateral dimension 2404. For example, the first medial lateral dimension 2406 can be disposed equidistant from each of the first upper lateral dimension 2402 and the first lower lateral dimension 2404, or can be disposed closer to the first upper lateral dimension 2402 or the first lower lateral dimension 2404. In some embodiments, the first medial lateral dimension 2406 is greater than either of the first upper lateral dimension 2402 or the first lower lateral dimension. In some embodiments, the first upper lateral dimension 2402 is greater than the first lower lateral dimension 2404. The dimension of the PO opening 2308 can vary based on the etching operations or sub-operations. For example, the upper portion of the irregular hexagon can have an angle relative to the upper surface of the semiconductor device of about 100 degrees to about 103 degrees. The lower portion of the irregular hexagon can have an angle relative to the upper surface of the semiconductor device of about 100 degrees to about 104 degrees.

Additional lateral dimensions can also undercut the surface of the semiconductor device in additional directions. For example, an isotropic etchant can remove etch the PO material 1306 in additional directions (e.g., into or out of the page as depicted in FIG. 24). Thus, various second, third, fourth (and so on) lateral dimensions can be defined along various cuts of the semiconductor device.

Figure 25:
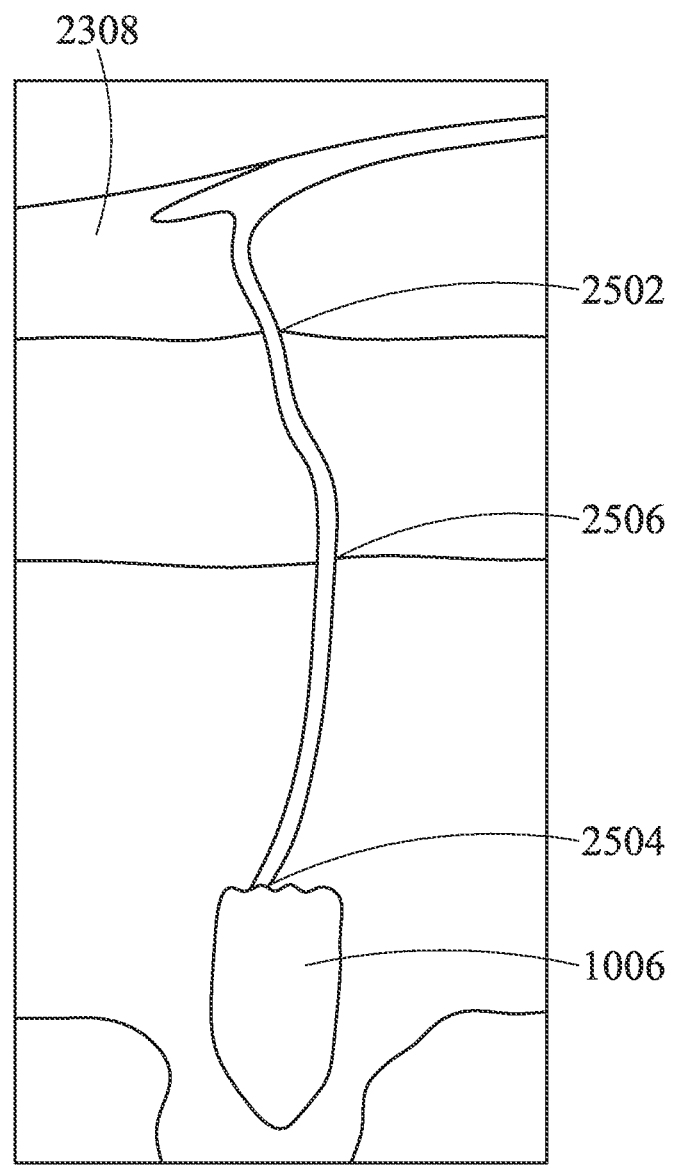

Referring now to FIG. 25, a detailed portion of a sidewall of the PO opening 2308 of FIG. 24 is illustrated. An upper sidewall intersection point 2502 is defined by the intersection of the first upper lateral dimension 2402 and the sidewall (e.g., at the junction of the PO material 1306 and the hardmask layer 2006). A lower sidewall intersection point 2504 is defined by the intersection of the first lower lateral dimension 2404 and the sidewall (e.g., at an upper surface of the high-k dielectric material 1006). A medial sidewall intersection point 2506 is defined by the intersection of the first medial lateral dimension 2406 and the sidewall (e.g., at a widest point of the opening in the depicted plane). As is depicted, the edges of the irregular hexagonal profile can be sloped (e.g., between about 100 and about 103 degrees), and the sidewall of the PO opening 2308 may be referred to as bowed, curved, or otherwise described. For example, a first angle 2310 between the upper surface of the PO opening 2308 and one sidewall can be between about 100 and about 103 degrees. A second angle 2312 between the upper surface of the PO opening 2308 and another sidewall can be between about 101 and about 103 degrees. A third angle 2314 between the lower surface of the PO opening 2308 and one sidewall can be between about 100 and 102 degrees. A fourth angle 2316 between the upper surface of the PO opening 2308 and another sidewall can be between about 102 and 104 degrees. A surface roughness of the sidewall may be present such that the lateral dimensions may be non-monotonic ascending or descending portions of the PO opening 2308. Descriptions of the sidewall orientations refer to the net displacement of the sidewall (e.g., along a vertical dimension). For example, the portion of the sidewall between the upper sidewall intersection point 2502 and the medial sidewall intersection point 2506 can be said to be tilted away from a mirrored sidewall (e.g., along a vertical direction extending from a top surface of the PO opening 2308 toward the substrate).

Figure 26:
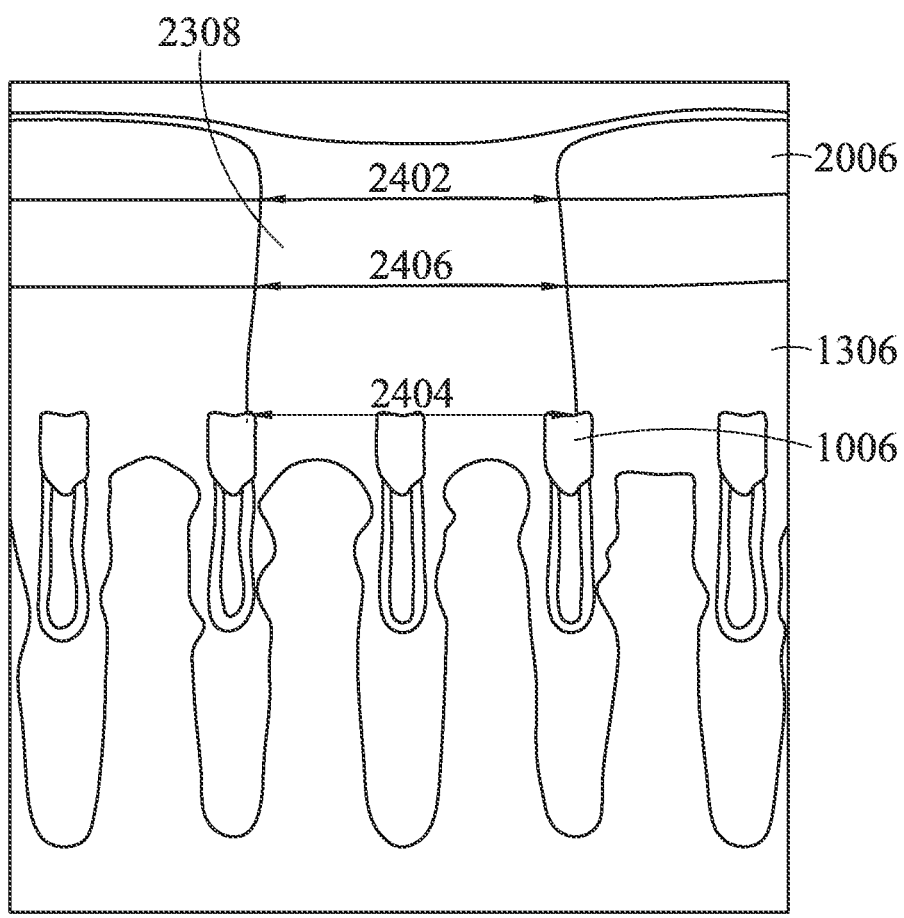

Referring now to FIG. 26, a PO opening 2308 having a trapezoidal profile is illustrated. The trapezoidal profile can be formed by performing alternating sub-operations of operation 134. For example, the oxygen flush sub-operation can passivate the sidewall of the PO opening 2308. The sidewalls of the PO opening are tilted away from each other along a vertical direction extending from a top surface of the PO opening 2308 toward the substrate (e.g., between about 92 and about 94 degrees). For example, a first upper lateral dimension 2402 disposed at a junction of a hardmask layer 2006 and a PO material 1306 can be of a lesser dimension of a first lower lateral dimension 2404. A first medial lateral dimension 2406 can be of greater dimension than the first upper lateral dimension 2402, and of lesser dimension than the first lower lateral dimension 2404. Thus, a dimension between the sidewalls generally increases as the opening is traversed in a downward direction. Although the surface roughness may result in some lateral dimensions disposed lower than other lateral dimensions being of somewhat decreased dimension, the sidewalls can be termed as substantially monotonic. More particularly, the substantially monotonic nomenclature refers to the increase or decrease of a lateral dimension between sidewalls of the PO opening 2308 for any segment greater than about one tenth of the depth of the PO opening 2308.

Figure 27:
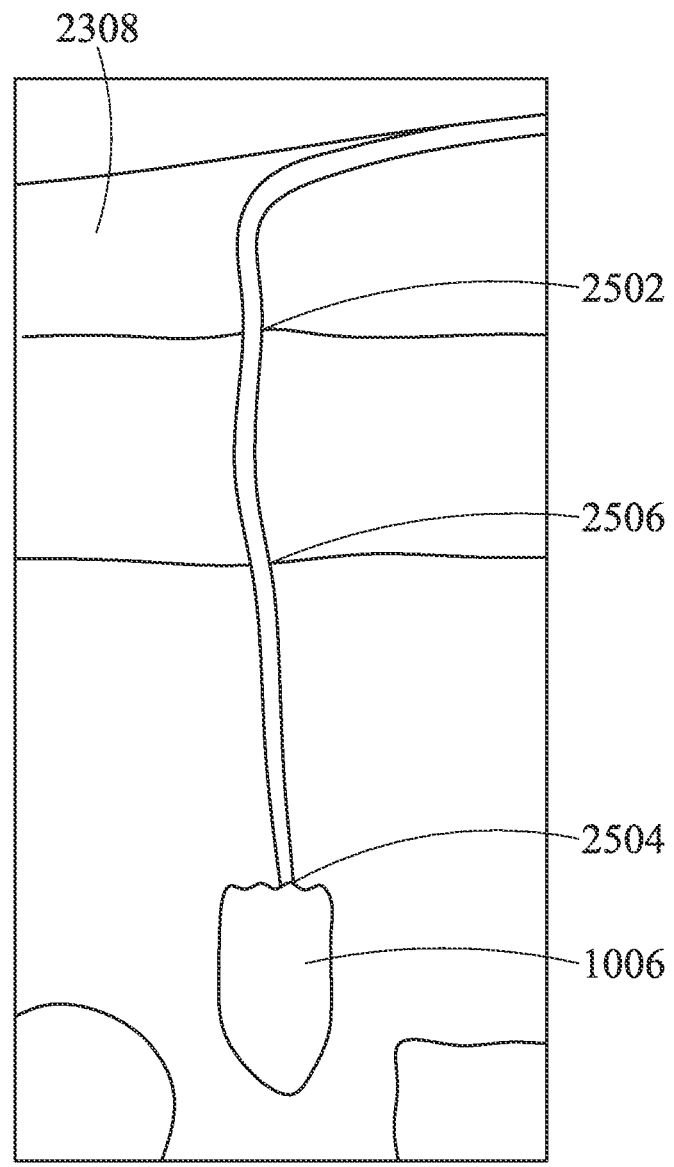

Referring now to FIG. 27, a detailed portion of a sidewall of the PO opening 2308 of FIG. 26 is illustrated. Each of the upper sidewall intersection point 2502, medial sidewall intersection point 2506, and lower sidewall intersection point 2504 are disposed along the sidewall. The sidewall extends at least from the upper surface of the PO opening 2308 to at least the upper surface of the high-k dielectric material 1006. In some embodiments, the sidewall can extend beyond the upper surface of the high-k dielectric material 1006. For example, the sidewall of the PO opening 2308 can include the high-k dielectric material 1006, or extend thereunder. The sidewall can contain a generally straighter edge, and generally lower surface roughness (e.g., due to the etching sub-operations, or the sequence of the sub-operations conducted). For example, the various sub-operations can interact with the sidewall chemically, or can eject material directionally. Thus various openings can be formed having sidewalls of varying profiles, surface roughness, chemical composition, and the like. The major features of the sidewalls can be defined as the slope of the sidewalls, less any surface roughness thereof. For example, the sidewalls of the trapezoidal profile can be termed as having a constant slope of its major features.

Figure 28:
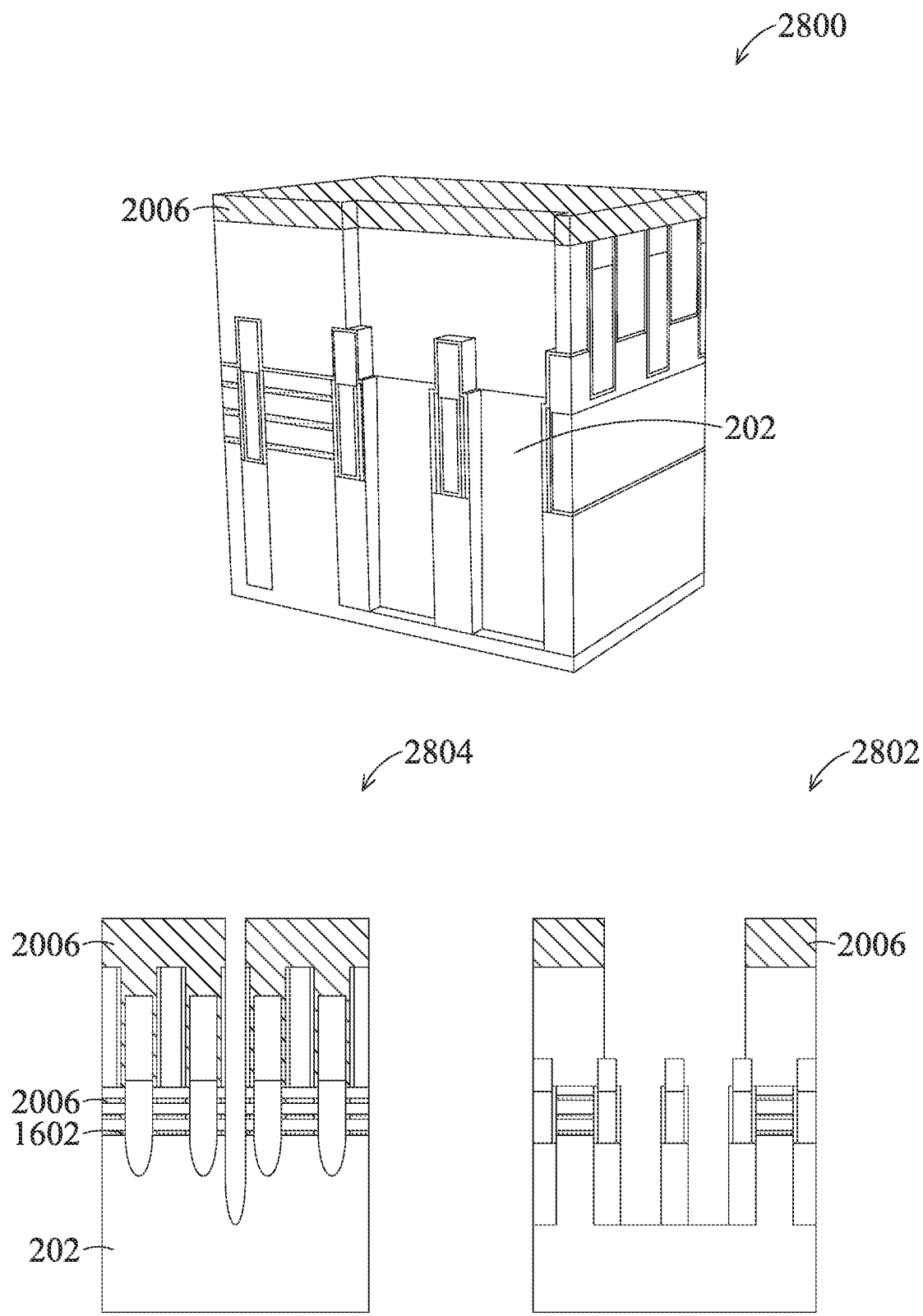

Corresponding to operation 136 of FIG. 1, FIG. 28 shows a perspective view 2800 and cross-sectional views 2802 and 2804 of the stack of layers undergoing the CPODE process. At this stage in the CPODE process, one or more directional etching processes are utilized to remove portions of the fourth dielectric material 1204, the substrate 202, and the layers of the sacrificial material 204 that are positioned beneath the slot defined by the hardmask layer 2006. To do so, particular etching processes can be utilized to prevent damage to the spacers 1602 during material removal. Implementations that do not utilize the techniques described herein may cause damage to the structures in the stack of layers during the etching process. The etched opening shown in FIG. 28 is a result of utilizing the techniques described in connection with FIG. 34. An example diagram of a top view of a result of a CPODE process is shown in FIG. 32.

Figure 32:
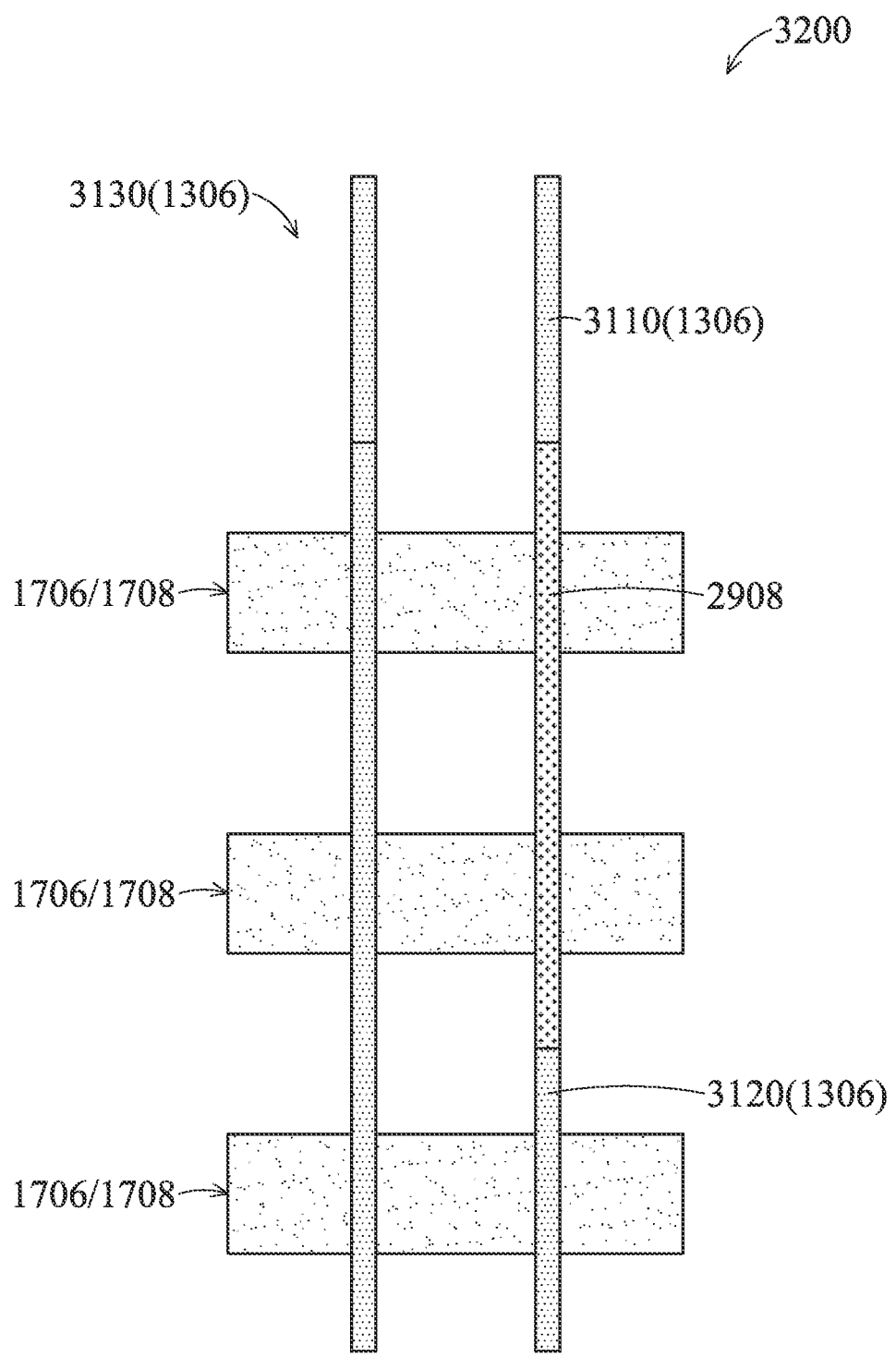
FIG. 32 shows an example diagram of a top view of a result of a CPODE process that is used to isolate one or more transistor devices, in accordance with some embodiments.

Referring temporarily to FIG. 32, shows an example diagram of a top view 3200 of a result of a CPODE process that is used to isolate one or more transistor devices, in accordance with some embodiments. As shown, in the top view 3200, the CPODE process can be used to isolate individual transistor structures (their respective gate structures, e.g., 3110 and 3120 as shown) from one another by etching and replacing portions of the PO material 1306 and replacing with a dielectric filler material 2908 (described in greater detail in connection with FIG. 29). Using the present techniques, the etching process to isolate the transistor structures described herein does not damage any portions of the transistor structures, resulting in reduced leakage current.

Figure 29:
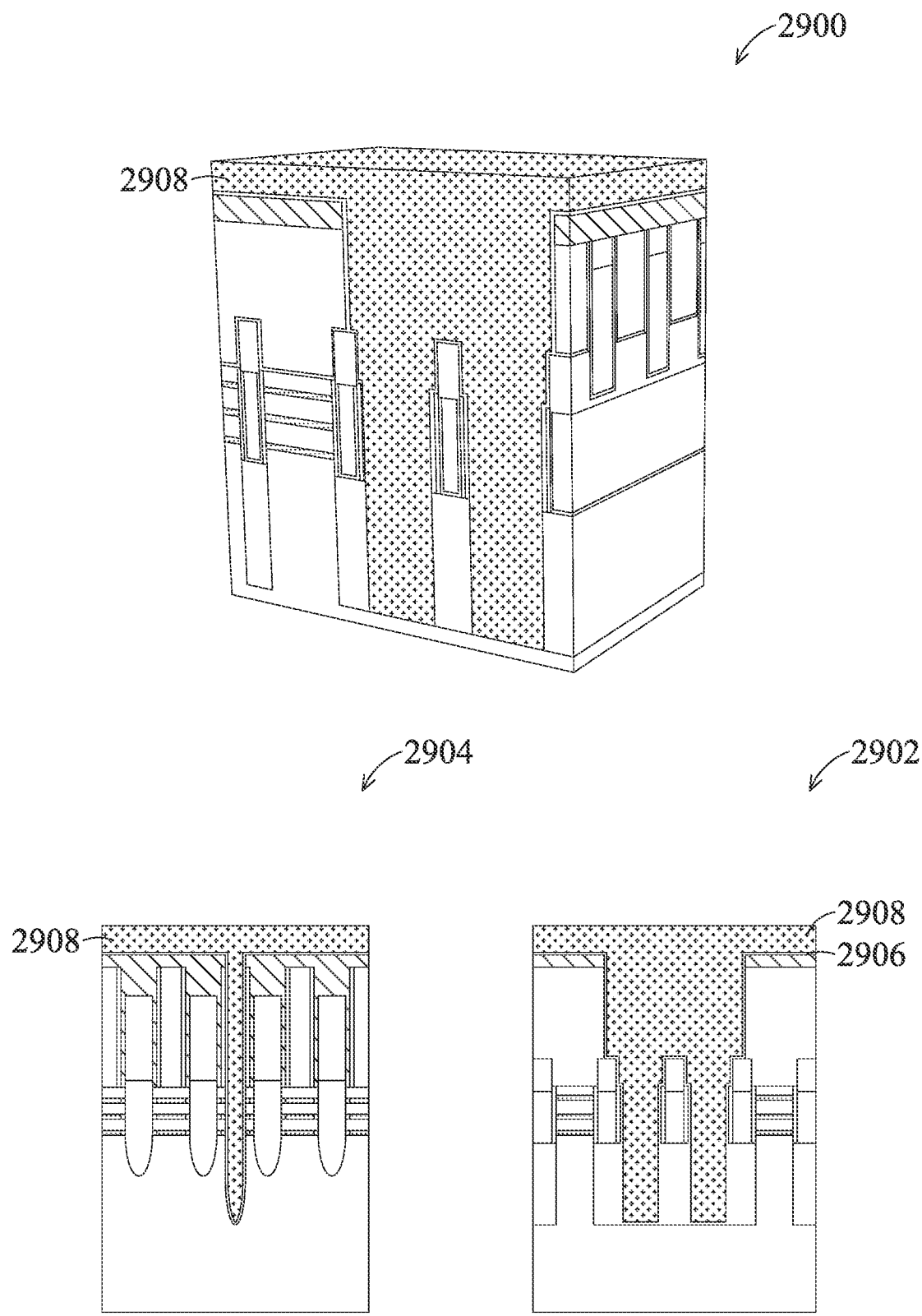

Corresponding to operation 138 of FIG. 1, FIG. 29 shows a perspective view 2900 and cross-sectional views 2902 and 2904 of the stack of layers following the deposition of one or more dielectric materials in the etched region of the device. As shown, a first thin layer of a dielectric fill material 2906 is first deposited over the entire device. The dielectric fill material 2906 can be any suitable dielectric material, including silicon oxide, silicon oxynitride, or the like. After forming the layer of the dielectric fill material 2906, a second dielectric fill material 2908 can be formed. The second dielectric fill material 2908 can be formed of silicon nitride, silicon oxynitride, silicon carbonitride, or the like. The dielectric fill material 2906 and the second dielectric fill material 2908 can each be formed using a suitable material deposition technique, such as ALD, CVD, PVD, FCVD, or the like.

Figure 30:
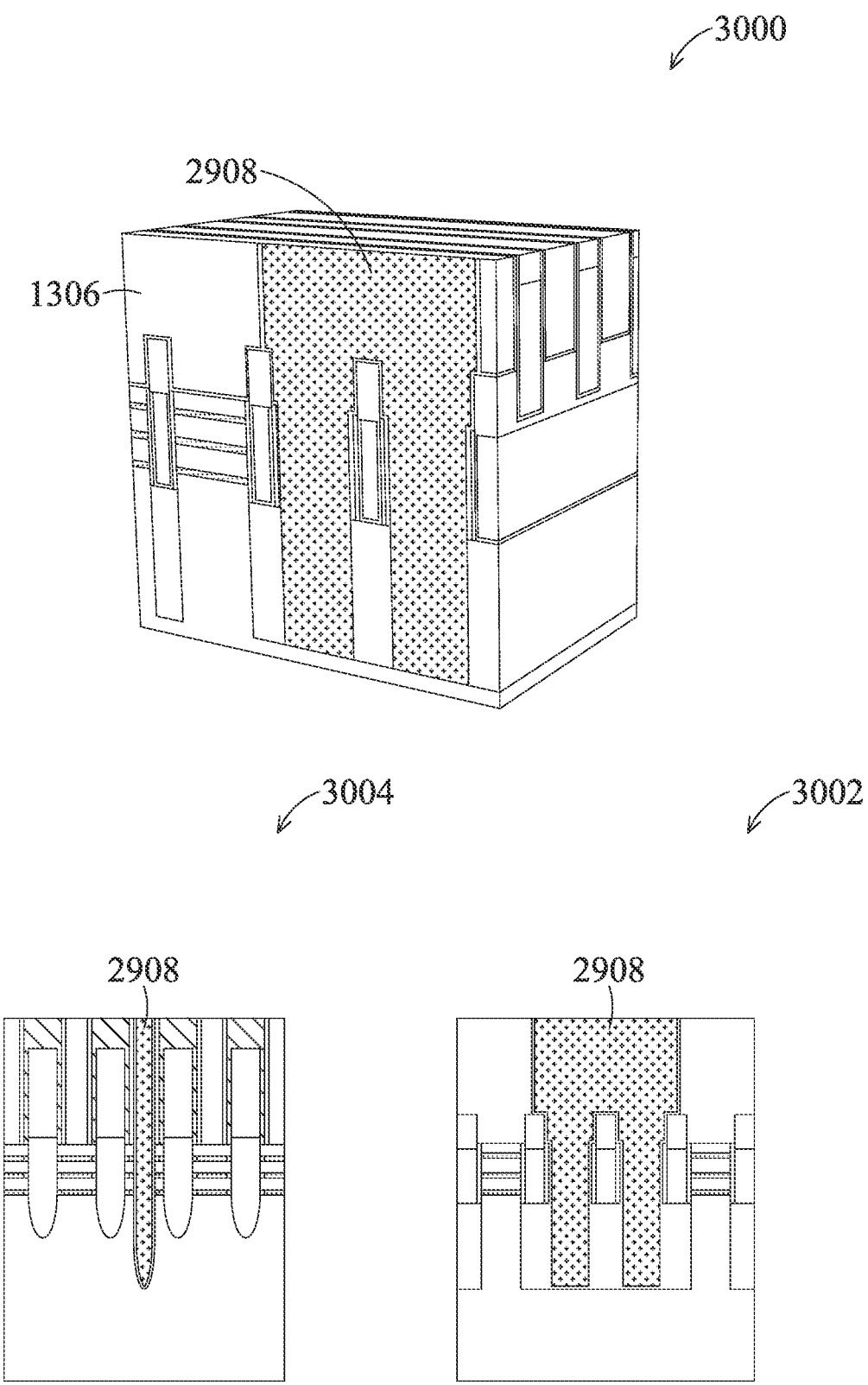

Still corresponding to operation 138 of FIG. 1, FIG. 30 shows a perspective view 3000 and cross-sectional views 3002 and 3004 of the stack of layers after a CMP process has been performed. After the second dielectric fill material 2908 has been deposited, a planarization process, such as a CMP process, may be performed to achieve a level upper surface for the device. The CMP may also remove the hardmask layer 2006 and the upper portions of the dielectric fill material 2906. After the planarization process, the upper surface of the second dielectric fill material 2908 is level with the upper surface of the PO material 1306, in some embodiments. As such, a dielectric structure that can electrically isolate (or "cut") active gate structures can be formed. Accordingly, such a dielectric structure 2908 may sometimes be referred to as dielectric structure 2908.

Figure 31:
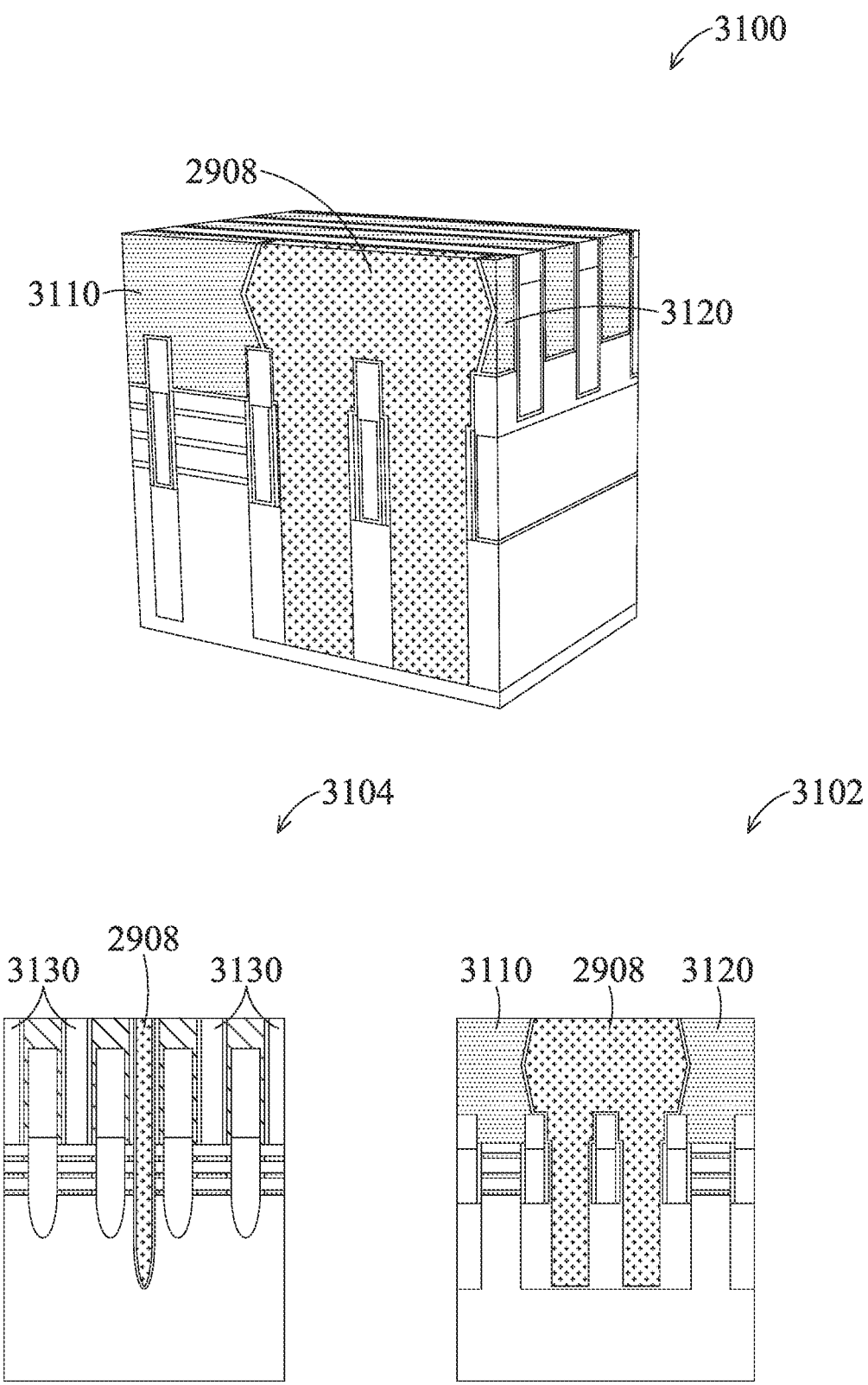

Corresponding to operation 140 of FIG. 1, FIG. 31 shows a perspective view 3100 and cross-sectional views 3102 and 3104 of the stack of layers. Following the removal of the PO material 1306, the fourth dielectric material 1204, and the sacrificial material 204, a number of active (e.g. metal) gate structures, e.g., 3110, 3120, and 3130, are formed. As shown, the PO material 1306, which previously acted as dummy gate structures, has been replaced with a number of active gate structures 3110, 3120, and 3130. As depicted, the sidewalls adjoining the dielectric structure can tilt away from each other along a vertical direction extending away from a top surface of the dielectric structure. Each of the active gate structures 3110 to 3130 can thus wrap around a respective number of substrate layers 202. Further, as shown in the cross-sectional view 3102 (e.g., cut along a lengthwise direction of the dielectric structure 2908 which can be better appreciated in the top view of FIG. 32), the active gate structures 3110 and 3120 can be physically and electrically isolated from each other by the dielectric structure 2908. With the dielectric structure 2908 formed in the profiles as disclosed above, it may facilitate the formation of active gate structures. As a reference, the cross-sectional view 3104 (e.g., cut along a lengthwise direction of the substrate layers 202 which can be better appreciated in the top view of FIG. 32), shows that a number of the active gate structures 3130 can also be separated by the dielectric structure 2908.

The active gate structures can be formed on the channel regions to create transistor devices in the stack of layers. The active gate structures can include a gate dielectric layer, a metal gate layer, and one or more other layers, which are not separately shown for clarity. For example, each of the active gate structures may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers can be each deposited to surround the semiconductive material that is grown on the layers of the substrate 202. The gate dielectric layers may include silicon oxide, silicon nitride, or multilayers thereof. In example embodiments, the gate dielectric layers each include a high-k dielectric material, and in these embodiments, the gate dielectric layers may each have a k value greater than about 7.0, and may include a metal oxide or a silicate of Hf, Al, Zr, La, Mg, Ba, Ti, Pb, or combinations thereof. The formation methods of the gate dielectric layers may include molecular beam deposition (MBD), ALD, and the like. A thickness of each of the gate dielectric layers may be between about 8 angstroms (Å) and about 20 Å, as an example.

The metal gate layers can each be formed over the respective gate dielectric layer. The metal gate layer can be formed in the region previously occupied by the PO material 1306. The metal gate layers may each be a P-type work function layer, an N-type work function layer, multilayers thereof, or combinations thereof, in some embodiments. Accordingly, the metal gate layers may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

In one aspect of the present disclosure, a semiconductor device is disclosed. The semiconductor device includes a first channel region. The first channel region is formed over a substrate, extends in a first lateral direction, and includes a pair of first epitaxial structures. The semiconductor device includes a second channel region. The second channel region is formed over a substrate, extends in the first lateral direction disposed next to the first channel region along a second lateral direction, and includes a pair of second epitaxial structures. The semiconductor device includes a third channel region. The third channel region is formed over a substrate, extends in the first lateral direction disposed next to the first channel region along the second lateral direction, and includes a pair of third epitaxial structures. The semiconductor device includes a first metal gate structure. The first metal gate structure extends in the second lateral direction and traverses the second channel region. The semiconductor device includes a second metal gate structure. The second metal gate structure extends in the second lateral direction and traverses the third channel region. The semiconductor device includes a dielectric structure interposed between the first pair of epitaxial structures along the first lateral direction, and between the first and second metal gate structures along the second lateral direction. A first upper portion of the dielectric structure can include opposite sidewalls tilted away from each other along a vertical direction extending from a top surface of the dielectric structure toward the substrate.

In another aspect of the present disclosure, a method for fabricating semiconductor devices is disclosed. The method includes forming a plurality of channel regions over a substrate. The plurality of channel regions, can be in parallel with one another, and extend along a first lateral direction. Each of the plurality of channel regions can include a plurality of semiconductor layers vertically spaced from one another and in contact with a pair of epitaxial structures. The method includes forming a gate structure over the plurality of channel regions. The gate structure can extend along a second lateral direction. The method includes removing a portion of the gate structure that was disposed over at least one of the plurality of channel regions, to form a gate recess. The portion can be removed through a first stage of an etching processes. The gate recess can include at least a first portion with its opposite sidewalls tilted away from each other with an increasing depth of the gate recess.

In yet another aspect of the present disclosure, a semiconductor device is disclosed. The semiconductor device includes a first channel region. The first channel region is formed over a substrate, extends in a first lateral direction, and includes a pair of first epitaxial structures. The semiconductor device includes a second channel region. The second channel region is formed over a substrate, extends in the first lateral direction disposed next to the first channel region along a second lateral direction, and includes a pair of second epitaxial structures. The semiconductor device includes a third channel region. The third channel region is formed over a substrate, extends in the first lateral direction disposed next to the first channel region along the second lateral direction, and includes a pair of third epitaxial structures. The semiconductor device includes a first metal gate structure. The first metal gate structure extends in the second lateral direction and traverses the second channel region. The semiconductor device includes a second metal gate structure. The second metal gate structure extends in the second lateral direction and traverses the third channel region. The semiconductor device includes a dielectric structure interposed between the first pair of epitaxial structures along the first lateral direction, and between the first and second metal gate structures along the second lateral direction. A first upper portion of the dielectric structure can have substantially monotonic opposite sidewalls along a vertical direction extending from a top surface of the dielectric structure toward the substrate.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first channel region formed over a substrate, extending in a first lateral direction, and comprising a pair of first epitaxial structures;
    a second channel region formed over the substrate, extending in the first lateral direction, disposed next to the first channel region along a second lateral direction, and comprising a pair of second epitaxial structures;
    a third channel region formed over the substrate, extending in the first lateral direction, disposed next to the first channel region along the second lateral direction, and comprising a pair of third epitaxial structures;
    a first metal gate structure extending in the second lateral direction and traversing the second channel region;
    a second metal gate structure extending in the second lateral direction and traversing the third channel region; and
    a dielectric structure interposed between the first pair of epitaxial structures along the first lateral direction, and between the first and second metal gate structures along the second lateral direction;
    wherein a first upper portion of the dielectric structure has its opposite sidewalls tilted away from each other along a vertical direction extending from a top surface of the dielectric structure toward the substrate.

2. The semiconductor device of claim 1, wherein the opposite sidewalls of the dielectric structure are in contact with sidewalls of the first metal gate structure and the second metal gate structures, respectively.

3. The semiconductor device of claim 1, wherein the first upper portion of the dielectric structure is disposed above the first to third pairs of the epitaxial structures.

4. The semiconductor device of claim 1, wherein the first channel region is disconnected in the first lateral direction by the dielectric structure.

5. The semiconductor device of claim 1, wherein an angle between the top surface and any of the opposite sidewalls is between about 92 degrees and about 94 degrees.

6. The semiconductor device of claim 1, wherein a second upper portion of the dielectric structure has its opposite sidewalls tilted toward each other along the vertical direction.

7. The semiconductor device of claim 6, wherein the second upper portion is disposed below the first upper portion, and wherein both of the first and second upper portions are disposed above the first to third pairs of the epitaxial structures.

8. The semiconductor device of claim 1, wherein the second channel region includes a plurality of first semiconductor layers vertically spaced from one another and in contact with the pair of second epitaxial structures, and the third channel region includes a plurality of second semiconductor layers vertically spaced from one another and in contact with the pair of third epitaxial structures.

9. The semiconductor device of claim 8, wherein the plurality of first semiconductor layers and the plurality of second semiconductor layers each extend in the first lateral direction, while the dielectric structure is further interposed between the plurality of first semiconductor layers and the plurality of second semiconductor layers along the second lateral direction.

10. The semiconductor device of claim 8, wherein the first metal gate structure wraps around each of the first semiconductor layers, and the second metal gate structure wraps around each of the second semiconductor layers.

11. A semiconductor device, comprising:
a first channel region formed over a substrate, extending in a first lateral direction, and comprising a pair of first epitaxial structures;
a second channel region formed over the substrate, extending in the first lateral direction, disposed next to the first channel region along a second lateral direction, and comprising a pair of second epitaxial structures;
a third channel region formed over the substrate, extending in the first lateral direction, disposed next to the first channel region along the second lateral direction, and comprising a pair of third epitaxial structures;
a first gate structure extending in the second lateral direction and traversing the second channel region;
a second gate structure extending in the second lateral direction and traversing the third channel region; and
a dielectric structure interposed between the first pair of epitaxial structures along the first lateral direction, and between the first and second gate structures along the second lateral direction;
wherein a first upper portion of the dielectric structure has substantially monotonic opposite sidewalls along a vertical direction extending from a top surface of the dielectric structure toward the substrate.

12. The semiconductor device of claim 11, wherein a dimension between the opposite sidewalls decreases along the vertical direction.

13. The semiconductor device of claim 11, wherein an angle between the top surface and a major features of the opposite sidewalls is about the same along the length of the sidewall.

14. A semiconductor device, comprising:
a plurality of channel regions disposed over a substrate, wherein the plurality of channel regions, in parallel with one another, extend along a first lateral direction, and wherein include a plurality of semiconductor layers vertically spaced from one another and in contact with a pair of epitaxial structures;
a gate structure disposed over a first one of the plurality of channel regions, wherein the gate structure extends along a second lateral direction; and
a dielectric structure disposed over a first one of the plurality of channel regions comprising opposite sidewalls tilted away from each other with an increasing depth from a surface of the semiconductor device.

15. The semiconductor device of claim 14, wherein the dielectric structure includes a second portion having its opposite sidewalls tilted toward each other with the increasing depth of the dielectric structure, wherein the second portion is disposed below a first portion having the opposite sidewalls tilted away from each other with the increasing depth.

16. The semiconductor device of claim 15, wherein the gate structure is an active gate structure comprising sidewalls conformal to the sidewalls of the dielectric structure.

17. The semiconductor device of claim 16, further comprising a barrier layer separating the sidewalls of the dielectric structure from the sidewalls of the active gate structure.

18. The semiconductor device of claim 16, wherein the conformal sidewalls terminate at an lateral upper surface of a second dielectric structure.

19. The semiconductor device of claim 18, wherein the dielectric structure and the active gate extend below the upper surface of the lateral upper surface of the second dielectric structure.

20. The semiconductor device of claim 14, wherein the dielectric structure extends below a bottom surface of the gate structure.

* * * * *